(12) United States Patent
Richter et al.

(10) Patent No.: US 9,583,640 B1
(45) Date of Patent: Feb. 28, 2017

(54) METHOD INCLUDING A FORMATION OF A CONTROL GATE OF A NONVOLATILE MEMORY CELL AND SEMICONDUCTOR STRUCTURE

(71) Applicant: GLOBALFOUNDRIES Inc., Grand Cayman (KY)

(72) Inventors: Ralf Richter, Dresden (DE); Sven Beyer, Dresden (DE); Carsten Grass, Dresden (DE); Tom Herrmann, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/982,028

(22) Filed: Dec. 29, 2015

(51) Int. Cl.
*H01L 29/788* (2006.01)
*H01L 29/66* (2006.01)
*H01L 29/423* (2006.01)
*H01L 27/115* (2006.01)

(52) U.S. Cl.
CPC .... *H01L 29/7887* (2013.01); *H01L 27/11531* (2013.01); *H01L 29/42328* (2013.01); *H01L 29/42332* (2013.01); *H01L 29/665* (2013.01); *H01L 29/66825* (2013.01)

(58) Field of Classification Search
None
See application file for complete search history.

(56) References Cited

U.S. PATENT DOCUMENTS

| | | | | |
|---|---|---|---|---|
| 5,883,409 A | * | 3/1999 | Guterman | G11C 11/5621 257/316 |
| 6,747,310 B2 | * | 6/2004 | Fan | H01L 27/11521 257/316 |
| 7,652,318 B2 | * | 1/2010 | Hsieh | H01L 27/115 257/314 |
| 7,868,375 B2 | * | 1/2011 | Liu | H01L 21/28273 257/320 |

(Continued)

OTHER PUBLICATIONS

Notice of Allowance from related U.S. Appl. No. 14/937,041 dated Sep. 29, 2016.

*Primary Examiner* — Michael Lebentritt
*Assistant Examiner* — Jordan Klein
(74) *Attorney, Agent, or Firm* — Amerson Law Firm, PLLC

(57) ABSTRACT

A method comprises providing a semiconductor structure including a nonvolatile memory cell element comprising a floating gate, a select gate and an erase gate formed over a semiconductor material, the select gate and the erase gate being arranged at opposite sides of the floating gate, forming a control gate insulation material layer over the semiconductor structure, forming a control gate material layer over the control gate insulation material layer, performing a first patterning process that forms a control gate over the floating gate and comprises a first etch process that selectively removes a material of the control gate material layer relative to a material of the control gate insulation material layer, and performing a second patterning process that patterns the control gate insulation material layer, the patterned control (Continued)

gate insulation material layer covering portions of the semiconductor structure that are not covered by the control gate.

20 Claims, 24 Drawing Sheets

(56) References Cited

U.S. PATENT DOCUMENTS

| | | | | |
|---|---|---|---|---|
| 8,901,632 | B1* | 12/2014 | Perera | H01L 29/7831 |
| | | | | 257/314 |
| 9,171,727 | B2 | 10/2015 | Nishikizawa et al. | |
| 9,196,748 | B2 | 11/2015 | Saito et al. | |
| 2003/0038313 | A1* | 2/2003 | Furuhata | H01L 27/105 |
| | | | | 257/296 |
| 2004/0256657 | A1* | 12/2004 | Hung | H01L 27/115 |
| | | | | 257/315 |
| 2005/0227440 | A1* | 10/2005 | Ema | H01L 21/823857 |
| | | | | 438/275 |
| 2007/0238249 | A1* | 10/2007 | Swift | B82Y 10/00 |
| | | | | 438/259 |
| 2008/0151590 | A1* | 6/2008 | Rogers | G11C 8/08 |
| | | | | 365/52 |
| 2014/0239367 | A1* | 8/2014 | Saito | H01L 29/788 |
| | | | | 257/319 |
| 2014/0242767 | A1* | 8/2014 | Nishikizawa | H01L 21/28008 |
| | | | | 438/275 |
| 2016/0064394 | A1* | 3/2016 | Chu | H01L 29/7883 |
| | | | | 257/321 |

* cited by examiner

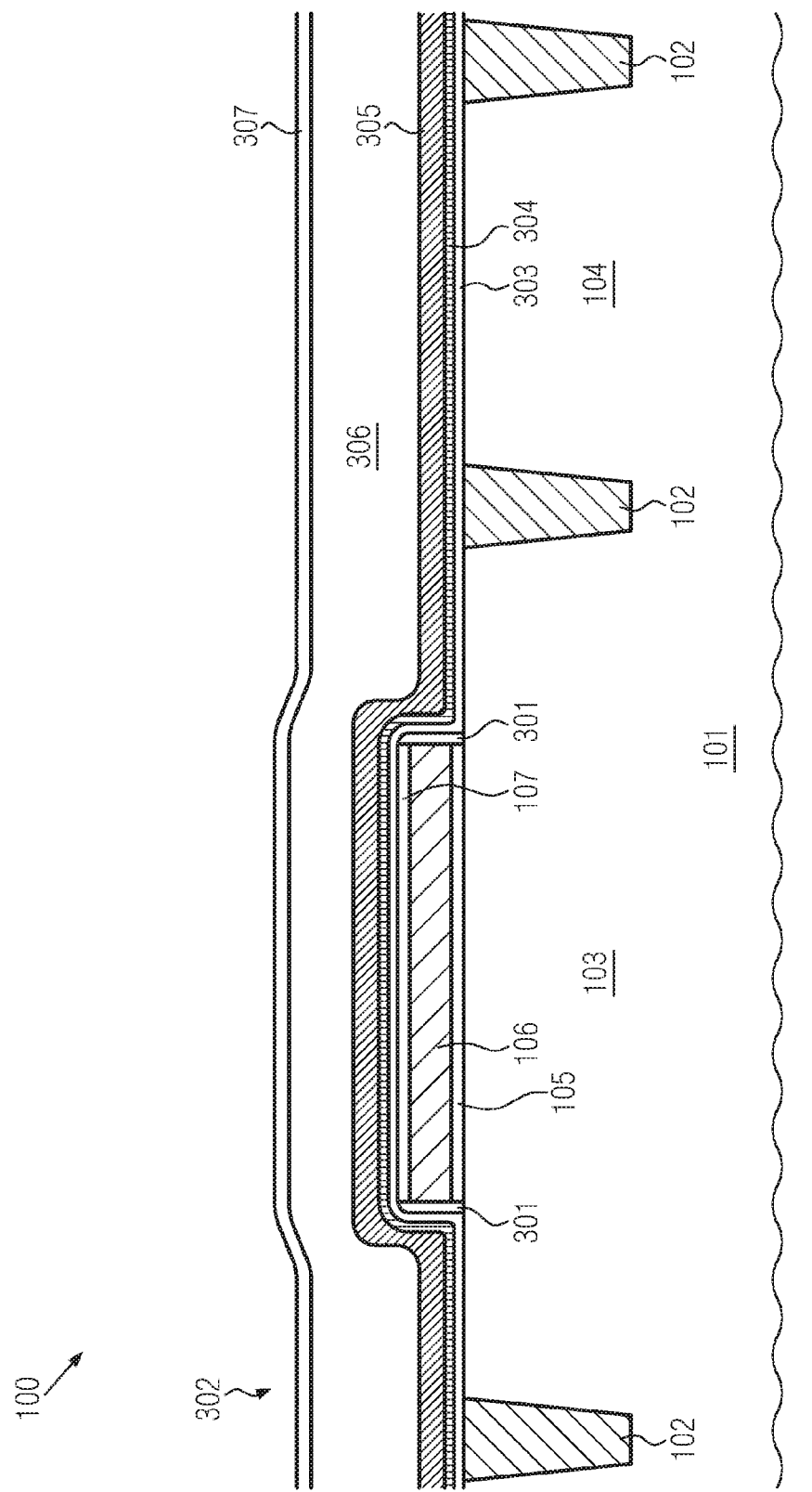

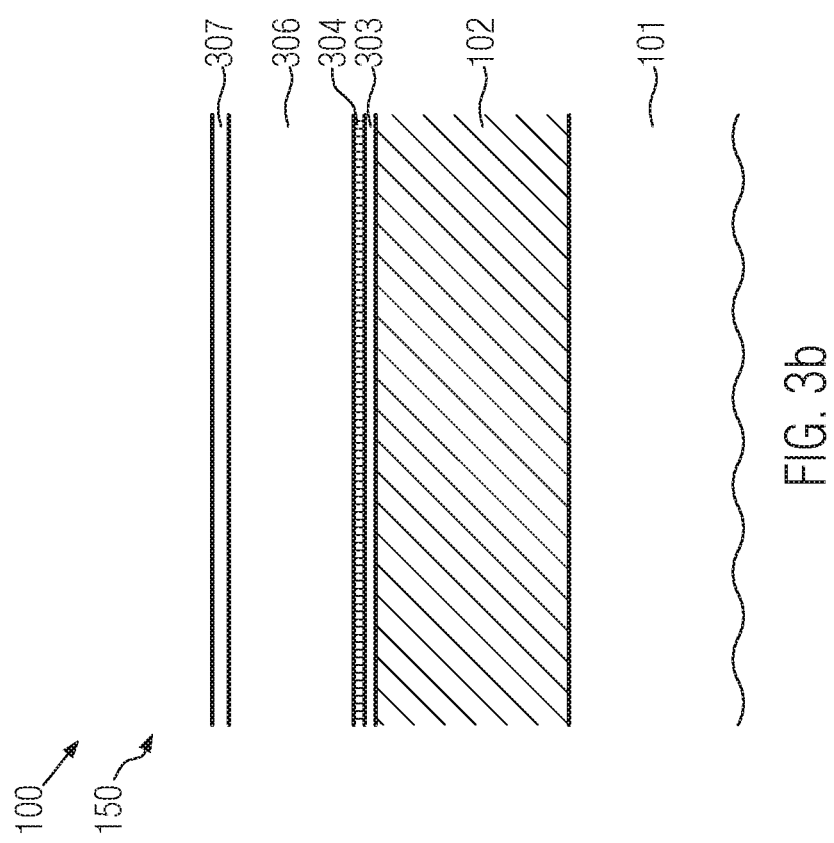

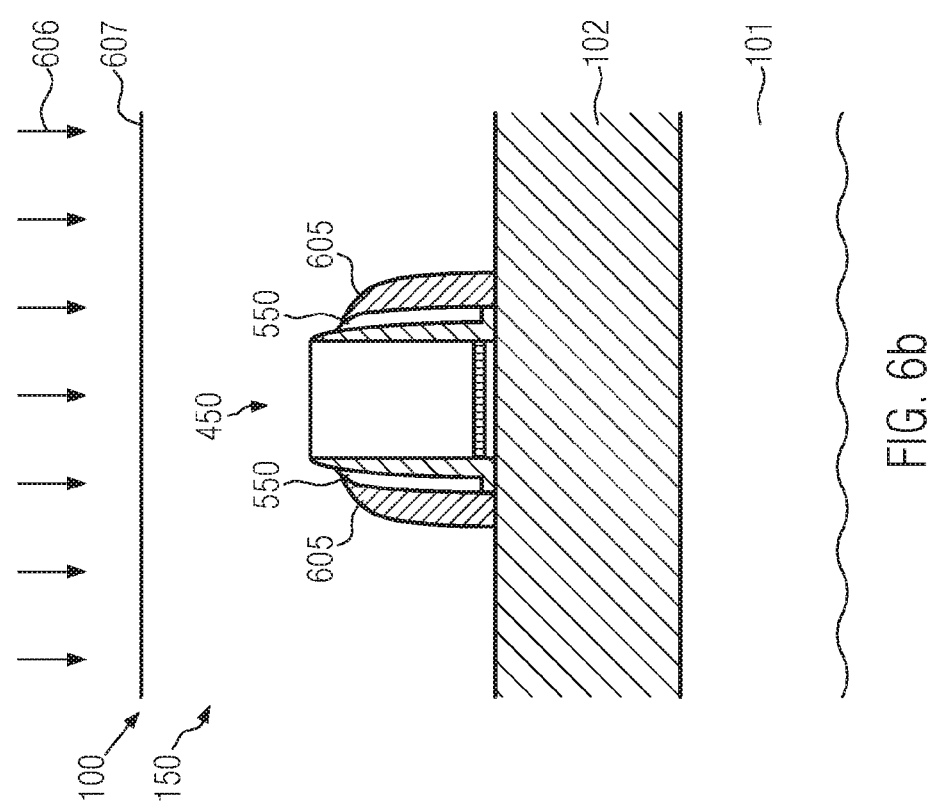

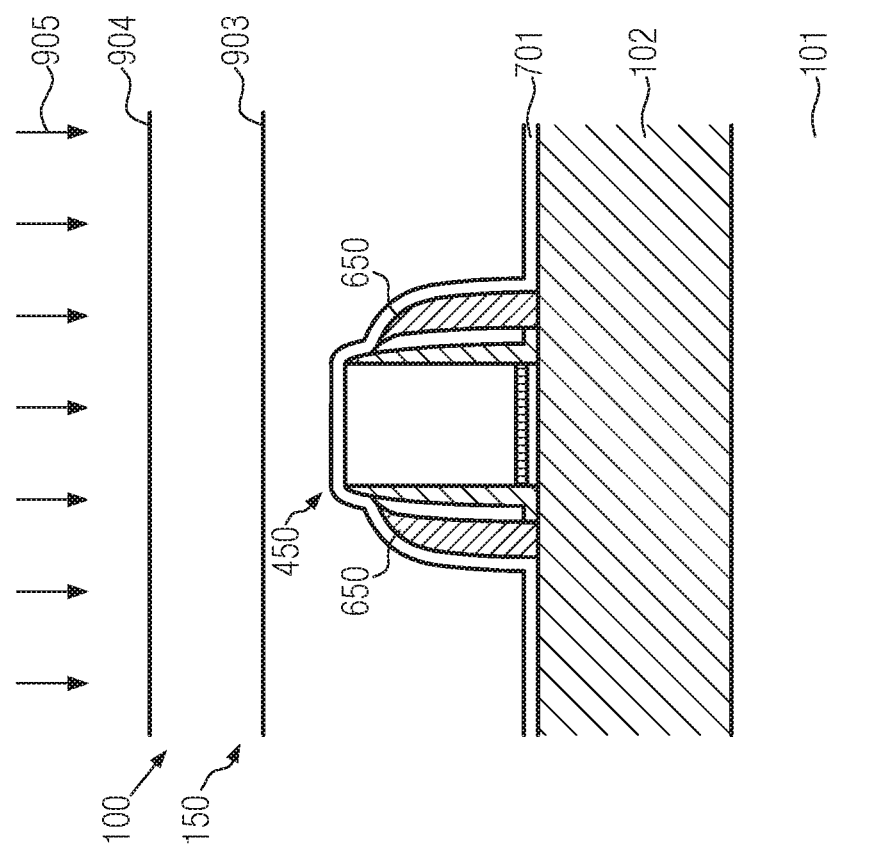

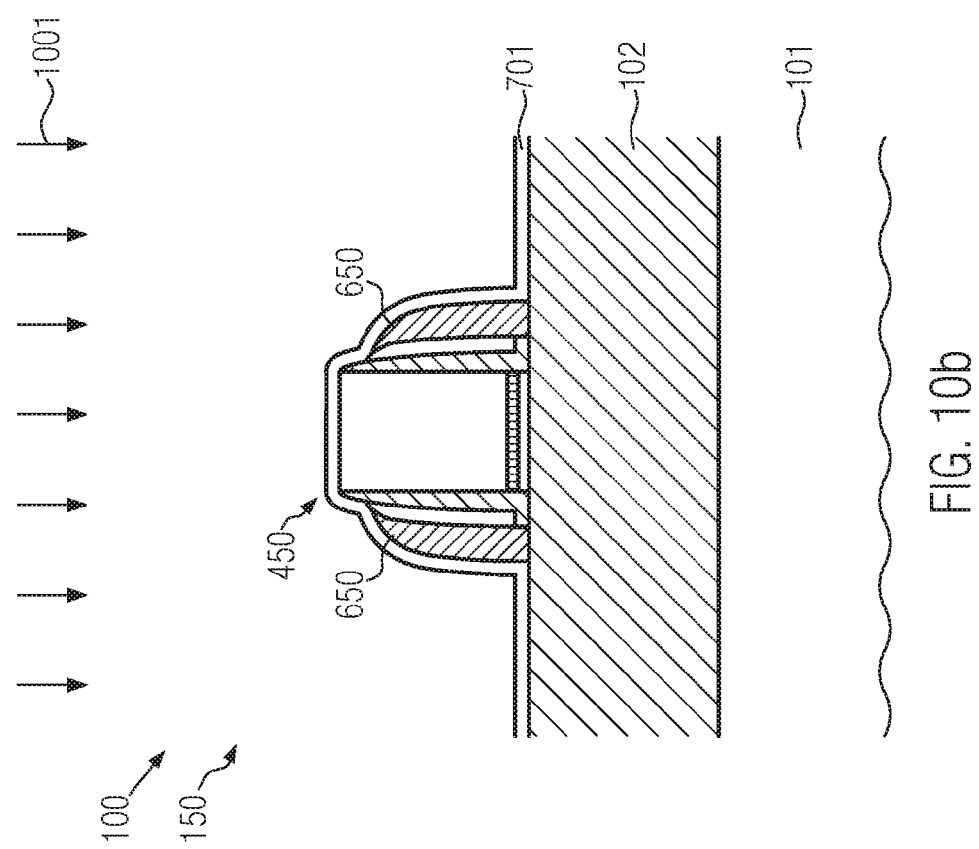

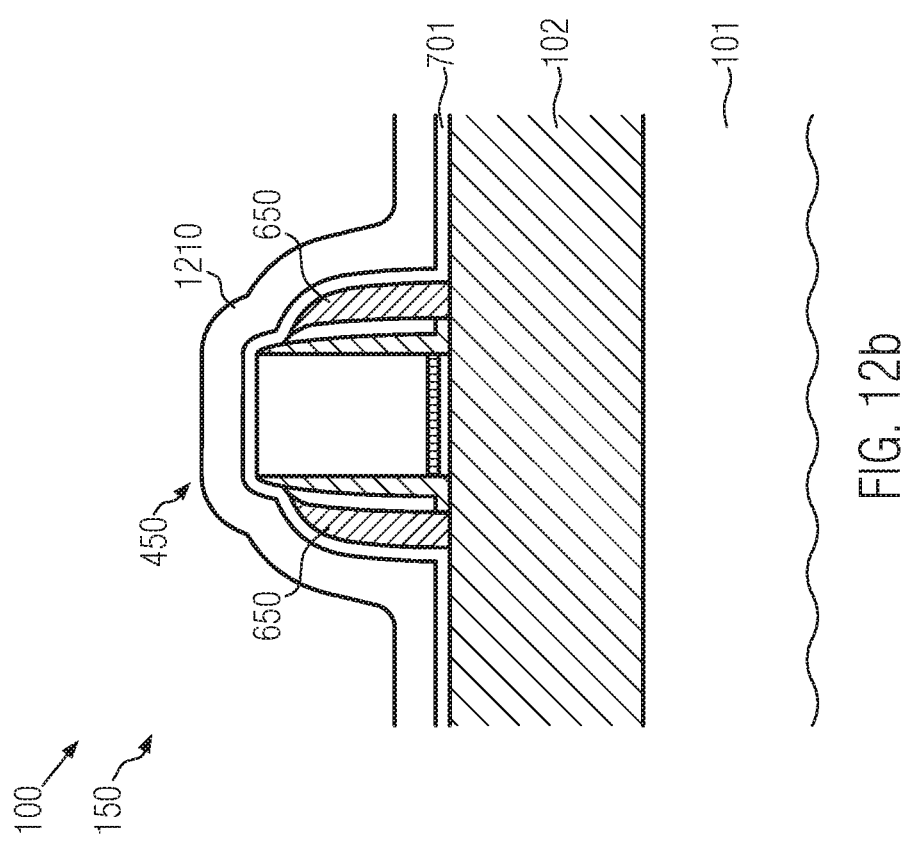

METHOD INCLUDING A FORMATION OF A CONTROL GATE OF A NONVOLATILE MEMORY CELL AND SEMICONDUCTOR STRUCTURE

BACKGROUND

1. Field of the Invention

Generally, the present disclosure relates to the field of integrated circuits and, more particularly, to integrated circuits including nonvolatile memory devices.

2. Description of the Related Art

Nonvolatile memory, such as, for example, flash memory, may be used in various storage devices, such as, for example, secure digital memory cards (SD cards), USB sticks, solid state drives (SSDs), and internal memory of various electronic devices, such as, for example, mobile phones, tablet computers, media players, etc. Further applications of nonvolatile memory include embedded systems, wherein nonvolatile memory blocks including nonvolatile memory are provided in addition to logic devices and wherein the nonvolatile memory devices and the logic devices are physically and electrically integrated on a single substrate, for example, a single monolithic silicon substrate. Devices that may be provided on the monolithic silicon substrate in addition to nonvolatile memory cells may include field effect transistors and other circuit elements, such as capacitors, inductivities, diodes and/or resistors. Embedded systems including nonvolatile memory find applications in various fields, such as, for example, in automotive, industry and communication market segments. Integrating nonvolatile memory and logic circuitry on a single substrate may help to improve performance and reduce costs compared to solutions wherein nonvolatile memory and logic circuitry are provided on separate substrates, for example, due to an elimination of input/output buffers, design flexibility, lower power consumption and/or system-on-a-chip capability.

Types of nonvolatile memory cell architectures that have been used in embedded systems include one transistor cells (1T-cells) including a single gate, as well as split gate solutions such as 1.5 transistor (1.5T) and 2 transistor (2T) cells.

Examples of known nonvolatile memory cells include those described in U.S. Pat. Nos. 6,747,310 and 7,868,375. Nonvolatile memory cells as described in U.S. Pat. Nos. 6,747,310 and 7,868,375 include a source region and a drain region that are formed in a semiconductor substrate. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate and the erase gate are electrically insulated from each other and from the source, drain and channel regions by electrically insulating materials. The floating gate may be surrounded by electrically insulating material so that it is electrically floating. The source region, the drain region, the select gate, the control gate and the erase gate may have respective electrical contacts connected thereto so that voltages may be applied to the source region, the drain region and the select, control and erase gates for performing operations of programming, erasing and reading the nonvolatile memory cell.

For programming the nonvolatile memory cell, voltages adapted for creating a relatively strong, substantially vertically oriented electrical field in the channel region between the select gate and the floating gate may be applied to the select and control gates and the source and drain regions, which may cause a hot electron injection into the floating gate so that the floating gate is electrically charged. In particular, relatively high voltages of about 11 V may be applied to the control gate when the nonvolatile memory cell is programmed. Since the floating gate is electrically floating, the charge injected into the floating gate may remain in the floating gate and may create an electric field that acts on a portion of the channel region below the floating gate.

For reading data from the nonvolatile memory cell, a voltage may be applied between the source region and the drain region, and a voltage adapted for creating an electrically conductive channel below the select gate may be applied to the select gate. Due to the influence of the electric charge in the floating gate on the portion of the channel region below the floating gate, a current flowing between the source region and the drain region may be influenced by the electric charge of the floating gate. Thus, it can be determined if an electric charge has been injected into the floating gate by means of a programming operation.

For erasing the nonvolatile memory cell, a relatively high positive voltage of, for example, about 12 V may be applied to the erase gate. In doing so, a Fowler-Nordheim tunneling of electrons from the floating gate to the erase gate may be obtained. Thus, an electric charge injected into the floating gate in the programming of the nonvolatile memory cell may be removed from the floating gate. The select gate can provide a separation of the floating gate from the drain which may help to substantially avoid or at least reduce an overerase phenomenon.

In known nonvolatile memory cells, the select gate, the control gate, the erase gate and the floating gate may be formed of polysilicon, and silicon dioxide, silicon nitride and/or silicon oxynitride may be used for providing an electrical insulation between the select gate, the control gate, the erase gate and the floating gate and for providing an electrical insulation between the gates and the source, drain and channel regions of the nonvolatile memory cell.

Nonvolatile memory cells as described above have been implemented in the 40 nm technology node. However, implementing nonvolatile memory cells as described above in smaller technology nodes, for example in the 28 nm technology node, may have issues associated therewith. Relatively complex manufacturing processes may be required for forming known nonvolatile memory cells since a number of processes of deposition of polysilicon and chemical mechanical polishing may have to be performed for forming the select gate, the control gate, the erase gate and the floating gate, wherein manufacturing processes for forming the nonvolatile memory cells may have to be performed in addition to processes for the manufacturing of other devices such as transistors, resistors, capacitors, inductivities and/or diodes. In particular, there may be integration issues when transistors on the same substrate are formed in accordance with high-k metal gate (HKMG) technology. Moreover, there may be issues related to providing an appropriate electrical insulation between the gates of the nonvolatile memory cells while maintaining a good controllability of the channel region. Such issues may relate both to the electrical insulation between the control gate and the select and erase gates provided adjacent the control gate and to dielectric reliability properties of the insulation between the control gate and the floating gate provided below the control gate.

The present disclosure provides semiconductor structures including nonvolatile memory cells and methods for the formation thereof which may help to substantially overcome or at least reduce some or all of the above-mentioned issues.

SUMMARY OF THE INVENTION

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a nonvolatile memory cell element having a floating gate, a select gate and an erase gate formed over a semiconductor material. The select gate and the erase gate are arranged at opposite sides of the floating gate. A control gate insulation material layer is formed over the semiconductor structure. A control gate material layer is formed over the control gate insulation material layer. A first patterning process is performed. The first patterning process forms a control gate over the floating gate and includes a first etch process that selectively removes a material of the control gate material layer relative to a material of the control gate insulation material layer. A second patterning process is performed. The second patterning process patterns the control gate insulation material layer. The patterned control gate insulation material layer covers portions of the semiconductor structure that are not covered by the control gate.

Another illustrative method disclosed herein includes providing a semiconductor structure that includes a nonvolatile memory cell element and a polysilicon resistor element. The nonvolatile memory cell element includes a floating gate over a semiconductor material. The polysilicon resistor element includes a polysilicon material. A control gate insulation material layer is formed over the semiconductor structure. The control gate insulation material layer includes a first sublayer including silicon dioxide, a second sublayer over the first sublayer including silicon nitride and a third sublayer over the second sublayer including silicon dioxide. A control gate is formed over the floating gate. A first portion of the control gate insulation material layer is arranged between the floating gate and the control gate. The control gate insulation material layer is patterned, wherein a silicide block layer is formed from a second portion of the control gate insulation layer over at least a part of the polysilicon material of the polysilicon resistor. A silicidation process is performed, wherein the silicide block layer substantially prevents a formation of silicide in the at least a part of the polysilicon material below the silicide block layer.

An illustrative semiconductor structure disclosed herein includes a nonvolatile memory cell and a polysilicon resistor that includes a polysilicon material. The nonvolatile memory cell includes a floating gate over a semiconductor material, a control gate over the floating gate and a source region, a channel region and a drain region provided in the semiconductor material. At least one of the drain region and the control gate includes a silicide. The semiconductor structure further includes a first silicon dioxide layer, a silicon nitride layer over the first silicon dioxide layer and a second silicon dioxide layer over the silicon nitride layer. Portions of the first silicon dioxide layer, the silicon nitride layer and the second silicon dioxide layer at the control gate provide a control gate insulation layer. At least a portion of the control gate insulation layer is provided between the control gate and the floating gate. Portions of at least the first silicon dioxide layer and the silicon nitride layer over at least a portion of the polysilicon material of the polysilicon resistor provide a silicide block layer. Substantially no silicide is provided in the at least a portion of the polysilicon material below the silicide block layer.

BRIEF DESCRIPTION OF THE DRAWINGS

The disclosure may be understood by reference to the following description taken in conjunction with the accompanying drawings, in which like reference numerals identify like elements, and in which:

FIGS. 1a-12b show schematic cross-sectional views of portions of a semiconductor structure according to an embodiment in stages of a method of manufacturing a semiconductor structure according to an embodiment.

Figure 1A:
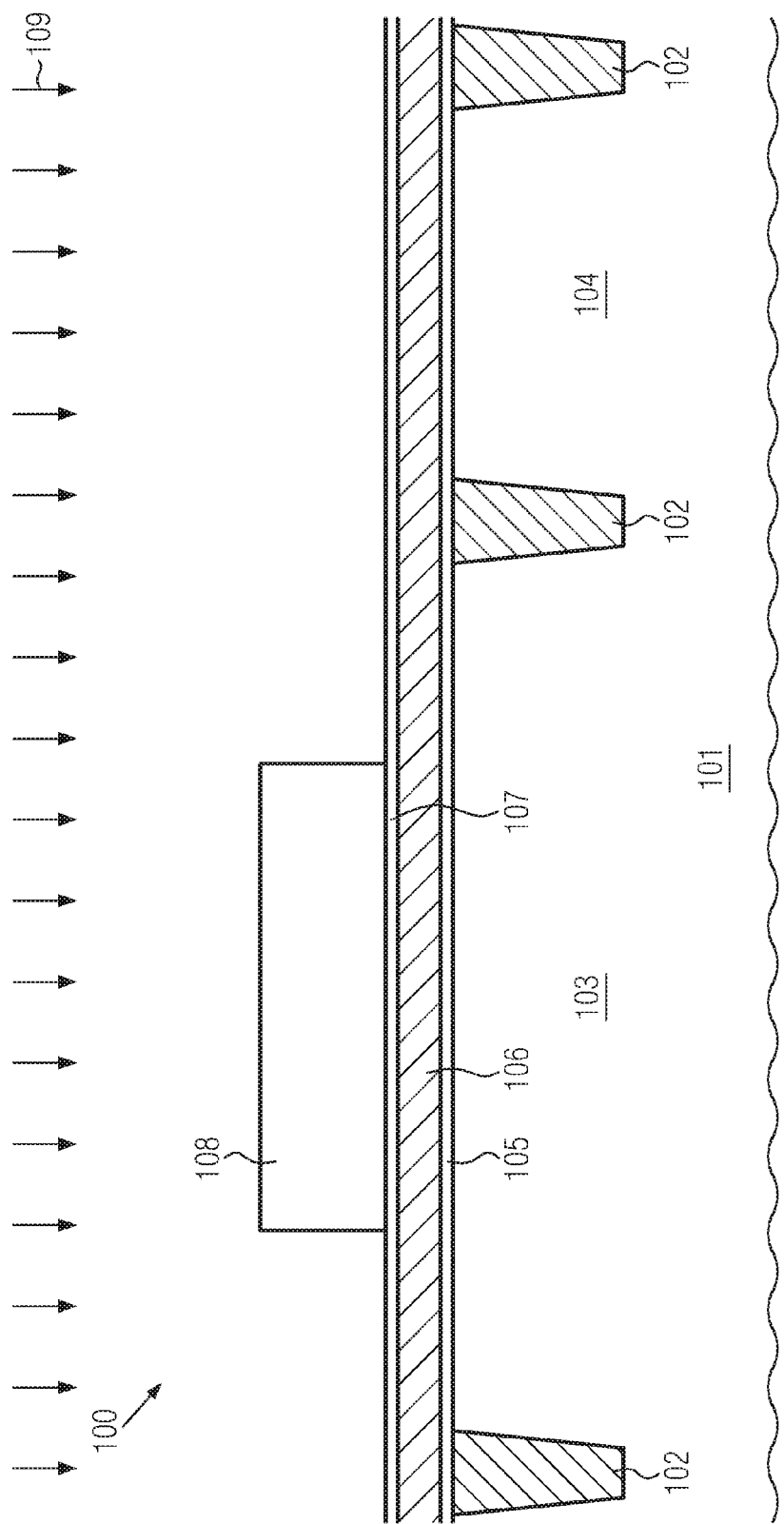

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein provide an integration concept for forming a control gate and a control gate insulation layer having an oxide-nitride-oxide (ONO) structure within a nonvolatile memory cell. In addition to the control gate and the control gate insulation layer, the nonvolatile memory cell may include a floating gate, a select gate and an erase gate that are formed over a semiconductor material wherein a source region, a channel region and a drain region are provided. The select gate and the erase gate may be arranged at opposite sides of the floating gate. At least portions of the floating gate, the control gate and the select gate may be provided over the channel region, and the erase gate may be provided over the source region. The formation of the nonvolatile memory cell element may be integrated into a process flow wherein field effect transistors having a high-k metal gate configuration are formed, a gate structure of the field effect transistors including a gate insulation layer including a high-k material having a greater dielectric constant than silicon dioxide and a gate electrode including a metal layer. In some embodiments, the select gate may have a high-k metal gate configuration, and it may be formed together with gate structures of field effect transistors provided in the semiconductor structure.

The patterning of the control gate may be performed after the completion of the high-k metal gate patterning, which may help to avoid a disturbance of etch and clean processes performed in the high-k metal gate patterning by processes employed for the formation of the control gate and/or the oxide-nitride-oxide control gate insulation layer. In a control gate etch process, wherein a layer of a control gate material is patterned, an oxide-nitride-oxide layer stack from which the control gate insulation layer is formed may be used as an etch stop layer, protecting portions of the semiconductor structure below the oxide-nitride-oxide layer stack, which may help to minimize an interaction with high-k metal gate structures provided in the select gates of the nonvolatile memory cells and/or gate structures of field effect transistors.

The deposition of the control gate material layer from which the control gate is formed may be performed directly after the deposition of the oxide-nitride-oxide layer stack from which the control gate insulation layer is formed. Thus, the control gate insulation layer may be sealed after the deposition of the control gate material layer. This may help to reduce a contamination with metal such as, for example, nickel, which may be employed in the formation of silicides in the semiconductor structure. Metal contaminations might adversely affect the reliability of the nonvolatile memory cell.

The thickness of the oxide-nitride-oxide layer stack from which the control gate insulation layer is formed, and the thicknesses of the individual sublayers thereof (two layers of silicon dioxide and one layer of silicon nitride therebetween), may be relatively precisely controlled by adjusting parameters of deposition processes employed for the formation thereof. The control gate insulation layer may be provided both between the control gate and the floating gate, and between the control gate and the select and erase gates. This may help to provide a relatively high dielectric reliability of the insulation between the gates, in particular, when relatively high voltages (about 12 V) are applied to the erase gate when the nonvolatile memory cell is erased, and relatively high voltages (about 11 V) are applied to the control gate in the programming of the nonvolatile memory cell. A thickness of the control gate insulation layer may be about 15 nm or more.

In some embodiments, the oxide-nitride-oxide layer stack employed for the formation of the control gate insulation layer may also be employed for providing a silicide block layer which may be used instead of conventional silicide block layers that are employed for substantially preventing a formation of a silicide in some portions of the semiconductor structure, for example, in polysilicon resistors and/or portions thereof. After patterning the control gate material layer for forming the control gate of the nonvolatile memory cell, a further patterning process may be performed for patterning the oxide-nitride-oxide layer stack. In this patterning process, portions of the oxide-nitride-oxide layer stack over parts of the semiconductor structure wherein a silicide is to be formed may be removed. In portions of the semiconductor structure wherein a formation of a silicide is to be avoided, the oxide-nitride-oxide layer stack and/or portions thereof, for example, the lower silicon dioxide layer and the silicon nitride layer, may remain in the semiconductor structure. In particular, portions of the oxide-nitride-oxide layer stack over polysilicon resistors in an OP region of the semiconductor structure may remain in the semiconductor structure after the patterning of the oxide-nitride-oxide layer stack. Thereafter, a resist strip for removing a photoresist mask used for patterning the oxide-nitride-oxide layer stack and a cleaning process may be performed. Then, a known silicidation process including a deposition of a layer of a metal such as, for example, nickel, and one or more annealing processes may be performed. Using the oxide-nitride-oxide layer stack for forming a silicide block layer may help to reduce the costs of the manufacturing of the semiconductor structure, since no separate silicide block layer needs to be formed. Additionally, a process complexity may be reduced and/or a greater margin for high-k metal gate encapsulation may be provided.

Figure 1B:
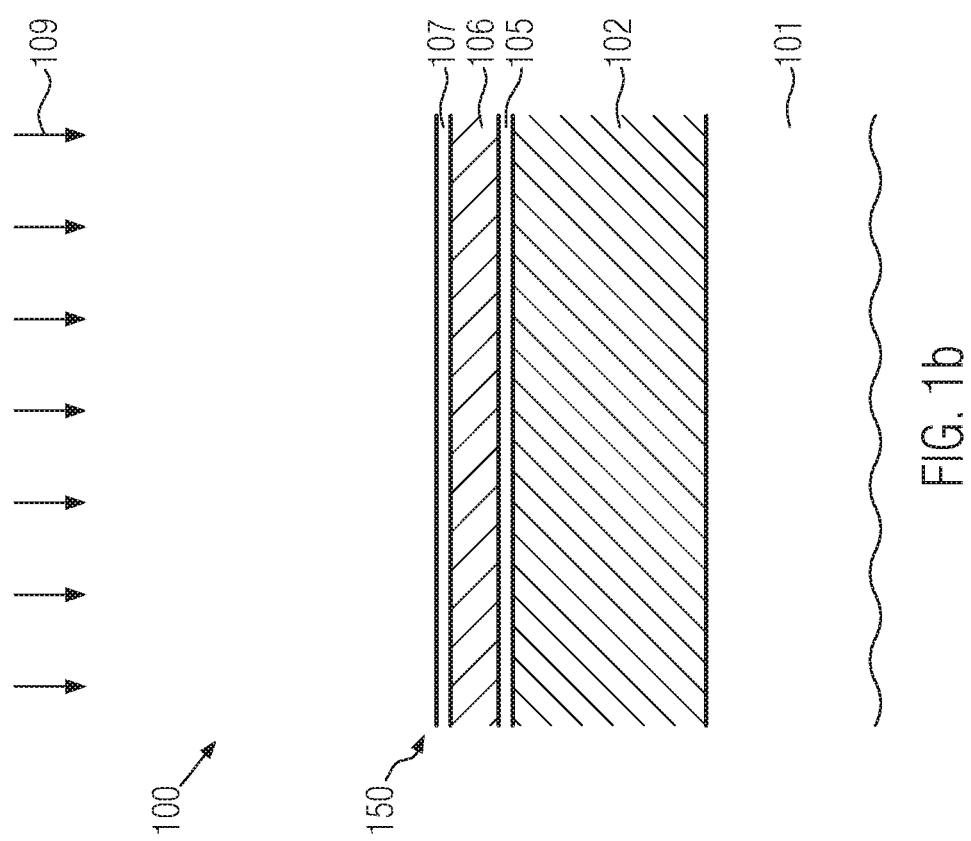

FIGS. 1a and 1b show schematic cross-sectional views of portion of a semiconductor structure 100 according to an embodiment in a stage of a method of manufacturing a semiconductor structure according to an embodiment. FIG. 1a shows portions of the semiconductor structure 100 wherein nonvolatile memory cells 1212, 1213 (see FIG. 12a) and a field effect transistor 1214 (see FIG. 12a) will be formed. FIG. 1b shows a portion of the semiconductor structure 100 wherein a polysilicon resistor 450 (see FIGS. 4b to 12b) will be formed, such as, for example an OP region of the semiconductor structure 100.

The semiconductor structure 100 includes a substrate 101. The substrate 101 may be a bulk semiconductor substrate formed of a semiconductor material, for example, a wafer formed of a semiconductor material such as silicon. In other embodiments, the substrate 101 may be a semiconductor-on-insulator substrate that includes a layer of a semiconductor material such as, for example, silicon that is provided above a support substrate, which may be a silicon wafer, and is separated from the support substrate by a layer of an electrically insulating material such as, for example, silicon dioxide.

The semiconductor structure 100 further includes a trench isolation structure 102. The trench isolation structure 102 may provide an electrical insulation between a nonvolatile memory region 103 and a logic transistor region 104 (FIG. 1a). Additionally, the trench isolation structure 102 may electrically insulate the nonvolatile memory region 103 and the logic transistor region 104 from other regions (not shown) wherein circuit elements are to be formed in the semiconductor structure 100. The nonvolatile memory region 103 and the logic transistor region 104 may be provided in the semiconductor material of the substrate 101 and may be doped for providing a doping of active regions of a nonvolatile memory cell and a logic transistor, respectively. A further portion of the trench isolation structure 102 may be provided in a resistor region 150 (FIG. 1*b*).

As will be detailed in the following, a pair of nonvolatile memory cells (denoted by reference numerals 1212 and 1213 in FIG. 12*a*) may be formed at the nonvolatile memory region 103, a logic transistor (denoted by reference numeral 1214 in FIG. 12*b*) may be formed at the logic transistor region 104 and a resistor (denoted by reference numeral 450 in FIGS. 4*b* to 12*b*) may be formed in the resistor region 150, wherein some method steps of the manufacturing process may be used both for forming features of the nonvolatile memory cells 1212, 1213, for forming features of the logic transistor 1214, and for forming features of the resistor 450.

The present disclosure is not limited to embodiments wherein the nonvolatile memory region 103 and the logic transistor region 104 are provided directly adjacent to each other, as shown in FIGS. 1*a* to 12*b*. In other embodiments, the nonvolatile memory region 103 and the logic transistor region 104 may be provided at a distance to each other, and regions wherein circuit elements other than the nonvolatile memory cells 1212, 1213 and the logic transistor 1214 are formed may be arranged between the nonvolatile memory region 103 and the logic transistor region 104. In some embodiments, the nonvolatile memory region 103 may be provided in a portion of the semiconductor structure 100 wherein a dedicated nonvolatile memory block of an integrated circuit is formed, and the logic transistor region 104 may be provided in a portion of the semiconductor structure 100 wherein a dedicated logic circuit block of the integrated circuit is formed. Similarly, the resistor region 150 may be provided at a distance to the nonvolatile memory region 103 and the logic transistor region 104.

The trench isolation structure 102 may be formed by means of known techniques for forming shallow trench isolation structures, which may include processes of photolithography and etching for forming trenches in the substrate 101, processes of oxidation and/or deposition for filling the trenches with an electrically insulating material such as silicon dioxide, and processes of etching and/or chemical mechanical polishing for removing portions of the electrically insulating material outside the trenches. For providing a doping of the nonvolatile memory region 103 and the logic transistor region 104, techniques of ion implantation may be used.

An electrically insulating layer 105 may be formed over the semiconductor material of the substrate 101 in the nonvolatile memory region 103, the logic transistor region 104 and the resistor region 150. In some embodiments, the electrically insulating layer 105 may be a silicon dioxide layer, and it may be formed by means of a thermal oxidation process, wherein the semiconductor structure 100 is exposed to an oxidizing ambient including water vapor and/or oxygen at an elevated temperature to oxidize the semiconductor material of the substrate 101. In other embodiments, the electrically insulating layer 105 may be formed by means of a deposition process adapted for the deposition of silicon dioxide, for example, a chemical vapor deposition process and/or a plasma-enhanced chemical vapor deposition process. The electrically insulating layer 105 may have a thickness in a range from about 5-15 nm, for example, a thickness of about 8 nm.

A layer 106 of a floating gate material may be formed over the electrically insulating layer 105. In some embodiments, the layer 106 of floating gate material may include a semiconductor material, for example, polycrystalline silicon, nanocrystalline silicon and/or amorphous silicon. Techniques for the deposition of silicon, such as chemical vapor deposition and/or plasma-enhanced chemical vapor deposition, may be used for depositing the layer 106 of floating gate material, wherein parameters of the deposition process may be adapted such that the desired crystalline structure of the deposited floating gate material is obtained. In some embodiments, the layer 106 of floating gate material may have a thickness in a range from about 10-40 nm, for example, a thickness of about 20 nm.

An electrically insulating layer 107 may be formed over the layer 106 of floating gate material. Similar to the electrically insulating layer 105, the electrically insulating layer 107 may include silicon dioxide, and it may have a thickness in a range from about 5-15 nm, for example, a thickness of about 8 nm. For forming the electrically insulating layer 107, deposition processes for the deposition of silicon dioxide, such as chemical vapor deposition and/or plasma-enhanced chemical vapor deposition, may be used. Alternatively, a thermal oxidation process may be performed, wherein a portion of the layer 106 of floating gate material is oxidized to form the electrically insulating layer 107. In such embodiments, the layer 106 of floating gate material may initially be deposited with a slightly greater thickness to take the loss of material of the layer 106 of floating gate material that is caused by the oxidation into account.

After the formation of the electrically insulating layers 105, 107 and the layer 106 of floating gate material, the electrically insulating layers 105, 107 and the layer 106 of floating gate material may be patterned. The patterning may include a formation of a mask 108 over a portion of the nonvolatile memory region 103. The mask 108 may be a photoresist mask, and it may be formed by means of techniques of photolithography. Thereafter, one or more etch processes, which are illustrated by arrows 109 in FIGS. 1*a* and 1*b*, may be performed. The one or more etch processes 109 may include one or more dry etch processes, for example, reactive ion etch processes, that are adapted for removing the materials of the electrically insulating layers 105, 107 and the layer 106 of floating gate material.

Figure 2A:
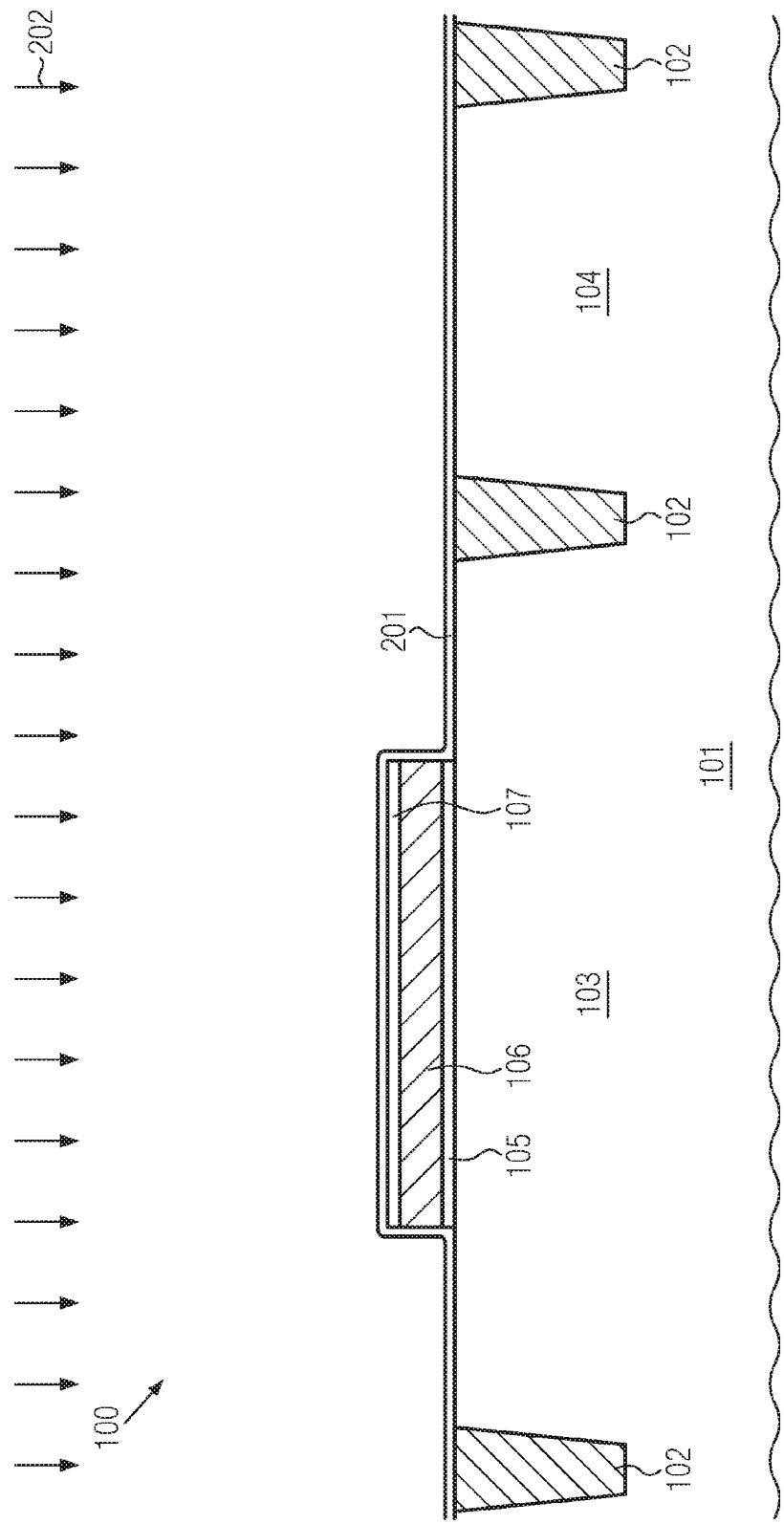
Figure 2B:
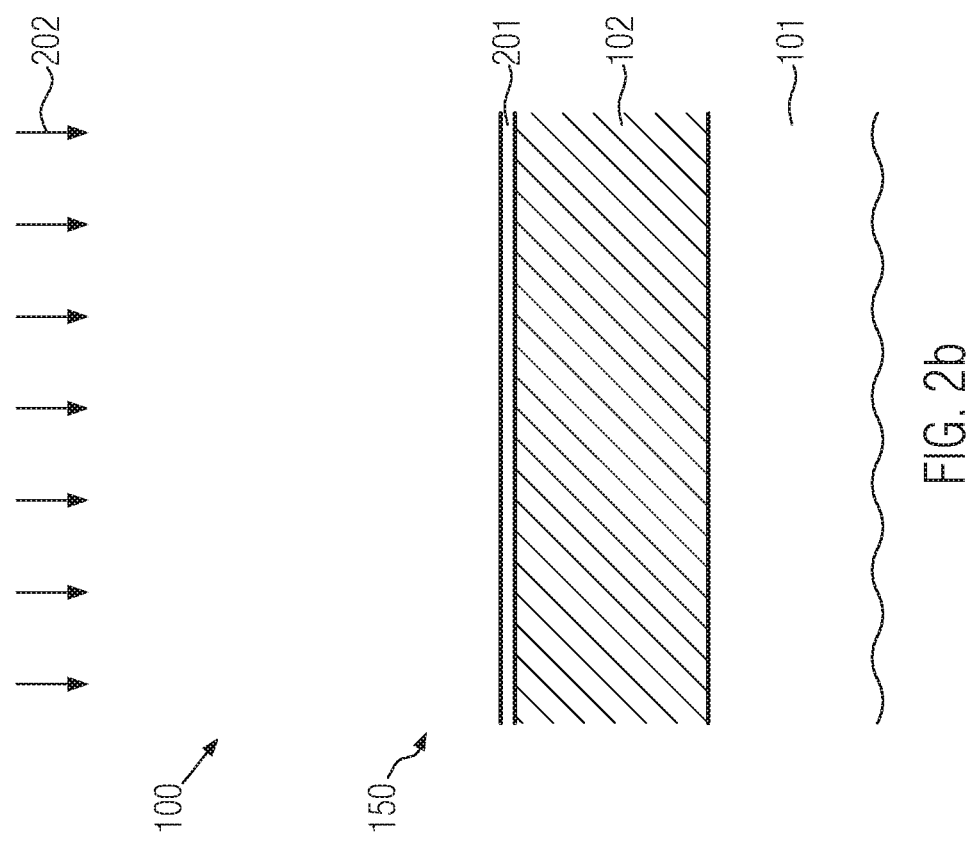

FIGS. 2*a* and 2*b* show schematic cross-sectional views of the portions of the semiconductor structure 100 shown in FIGS. 1*a* and 1*b* in a later stage of the manufacturing process. In the one or more etch processes 109, portions of the electrically insulating layers 105, 107 and the layer 106 of floating gate material which are not covered by the mask 108 may be removed from the semiconductor structure 100 so that the semiconductor material of the substrate 101 is exposed in the logic transistor region 104, the resistor region 150 and in portions of the nonvolatile memory region 103. Portions of the electrically insulating layers 105, 107 and the layer 106 of floating gate material that are covered by the mask 108 during the one or more etch processes 109 may remain in the semiconductor structure 100.

After the one or more etch processes, the mask 108 may be removed by means of a resist strip process, and an electrically insulating layer 201 may be deposited over the semiconductor structure 100. The electrically insulating layer 201 may include silicon dioxide, and it may have a thickness in a range from about 3-15 nm, for example, a thickness of about 8 nm. The electrically insulating layer 201 may be formed by means of a deposition process such as a chemical vapor deposition process and/or a plasma-enhanced chemical vapor deposition process that is adapted for the deposition of silicon dioxide.

After the formation of the electrically insulating layer 201, an anisotropic etch process that is adapted for the removal of the material of the electrically insulating layer 201 may be performed. In FIGS. 2a and 2b, the anisotropic etch process is schematically illustrated by arrows 202. The anisotropic etch process 202 may be a dry etch process adapted for the removal of silicon dioxide, for example, a reactive ion etch process.

FIGS. 3a and 3b show schematic cross-sectional views of the portions of the semiconductor structure 100 shown in FIGS. 2a and 2b in a later stage of the manufacturing process. The anisotropic etch process 202 may remove portions of the electrically insulating layer 201 over substantially horizontal portions of the semiconductor structure 100, for example, portions of the electrically insulating layer 201 over a top surface of the layer stack formed by the electrically insulating layers 105, 107 and the layer 106 of floating gate material, and surfaces of the semiconductor material of the substrate 101 in the nonvolatile memory region 103 that are located at a distance to the layer stack. Moreover, the anisotropic etch process 202 may remove portions of the electrically insulating layer 201 over the logic transistor region 104 and the resistor region 150 so that the semiconductor material of the substrate 101 is exposed in the logic transistor region 104 and the resistor region 150. Due to the anisotropy of the anisotropic etch process 202, portions of the electrically insulating layer 201 at the sidewalls of the layer stack formed by the electrically insulating layers 105, 107 and the layer 106 of floating gate material may remain in the semiconductor structure and may form a sidewall spacer 301 at sidewalls of the layer stack. In particular, the sidewall spacer 301 may cover sidewalls of the layer 106 of floating gate material. Thus, the layer 106 of floating gate material is surrounded by the electrically insulating material of the electrically insulating layers 105, 107 and the sidewall spacer 301.

After the formation of the sidewall spacer 301, a gate stack 302 may be formed over the semiconductor structure 100. The gate stack 302 may include a base layer 303, a layer 304 of a high-k dielectric material, a metal layer 305, a layer 306 of a semiconductor material and a capping layer 307.

The base layer 303 may be a silicon dioxide layer, and it may have a thickness that is smaller than the thicknesses of the electrically insulating layers 105, 107 and 201. In particular, the thickness of the base layer 303 may be smaller than the thickness of the sidewall spacer 301, being an extension of the sidewall spacer 301 in a direction parallel to the surface of the substrate 101 (horizontal in the plane of drawing of FIG. 3a). In some embodiments, a total thickness of the base layer 303 and the layer 304 of high-k dielectric material may also be smaller than the thickness of the sidewall spacer 301. The thickness of the sidewall spacer 301 may be approximately equal to or slightly smaller than the thickness of the electrically insulating layer 201. In some embodiments, the base layer 303 may have a thickness in a range from about 0.6-4 nm, for example, a thickness of about 1 nm. The base layer 303 may be formed by means of oxidation, chemical vapor deposition and/or plasma-enhanced chemical vapor deposition.

The layer 304 of high-k dielectric material may include a dielectric material having a greater dielectric constant than silicon dioxide. In some embodiments, the high-k dielectric material of the layer 304 may have a dielectric constant greater about 4. In some embodiments, the layer 304 of high-k dielectric material may include one or more of hafnium dioxide, zirconium dioxide, hafnium silicon oxynitride, zirconium silicon oxynitride and/or hafnium zirconium oxide. The layer 304 of high-k dielectric material may be formed by means of techniques for the deposition of high-k dielectric materials which may include atomic layer deposition, chemical vapor deposition, plasma-enhanced chemical vapor deposition and/or physical vapor deposition.

The metal layer 305 may include a metal having a workfunction that is suitable for workfunction engineering in N-channel field effect transistors such as, for example, lanthanum, lanthanum nitride and/or titanium nitride. The metal layer 305 need not be a substantially homogeneous layer. In some embodiments, the metal layer 305 may include sublayers that are formed of different metals.

The layer 306 of semiconductor material may include polysilicon, and it may be formed by means of chemical vapor deposition and/or plasma-enhanced chemical vapor deposition. The capping layer 307 may include one or more dielectric materials such as, for example, silicon dioxide, silicon nitride and/or silicon oxynitride, and it may be formed by means of chemical vapor deposition and/or plasma-enhanced chemical vapor deposition.

Further features of the gate stack 302 may correspond to those of gate stacks that are conventionally employed in the formation of gates of field effect transistors in accordance with high-k metal gate techniques, wherein a gate-first approach is employed. In particular, features of the gate stack 302 may correspond to features of gate stacks that are formed over portions of a semiconductor structure wherein N-channel field effect transistors are to be formed.

In some embodiments, after depositing the metal layer 305 over the semiconductor structure 100, a portion of the metal layer 305 over the resistor region 150 may be removed. For this purpose, a mask (not shown), for example a photoresist mask, may be formed over the nonvolatile memory region 103 and the logic transistor region 104. Thereafter, an etch process adapted for removing the metal of the metal layer 305 may be performed. Then, the mask may be removed, for example, by means of a resist strip process. Then, the formation of the gate stack 302 may be continued with the deposition of the layer 306 of semiconductor material and the capping layer 307. Removing the portion of the metal layer 305 in the resistor region 150 may help to increase a resistance of the resistor to be formed in the resistor region 150, since the metal layer 305 may have a smaller resistivity than the layer 306 of semiconductor material. In other embodiments, the portion of the metal layer 305 in the resistor region 150 may remain in the semiconductor structure 100.

The present disclosure is not limited to embodiments wherein the sidewall spacer 301 is formed. In other embodiments, the formation of the electrically insulating layer 201 and the anisotropic etch process 202 may be omitted so that the sidewall spacer 301 is not formed. In such embodiments, the layer 106 of floating gate material is surrounded by the electrically insulating materials of the electrically insulating layers 105, 107, the base layer 303 and the layer 304 of high-k dielectric material. However, providing the sidewall spacer 301 may help to reduce a coupling between floating gates and select gates of nonvolatile memory cells, which may help to substantially prevent read disturbs in the reading of data from the nonvolatile memory cells. Furthermore, the sidewall spacer 301 may help to substantially prevent an electrical breakdown between the floating gate and the select gate or at least reduce the likelihood of an electrical breakdown occurring. Moreover, the sidewall spacer 301 may substantially prevent or at least reduce a tunneling current between the floating gate and the select gate. The base layer 303 may be provided with a relatively small thickness which may help to improve the controllability of a channel region of the nonvolatile memory cell. The formation of the floating gates, select gates and channel regions of the nonvolatile memory cells will be described below.

Figure 4A:
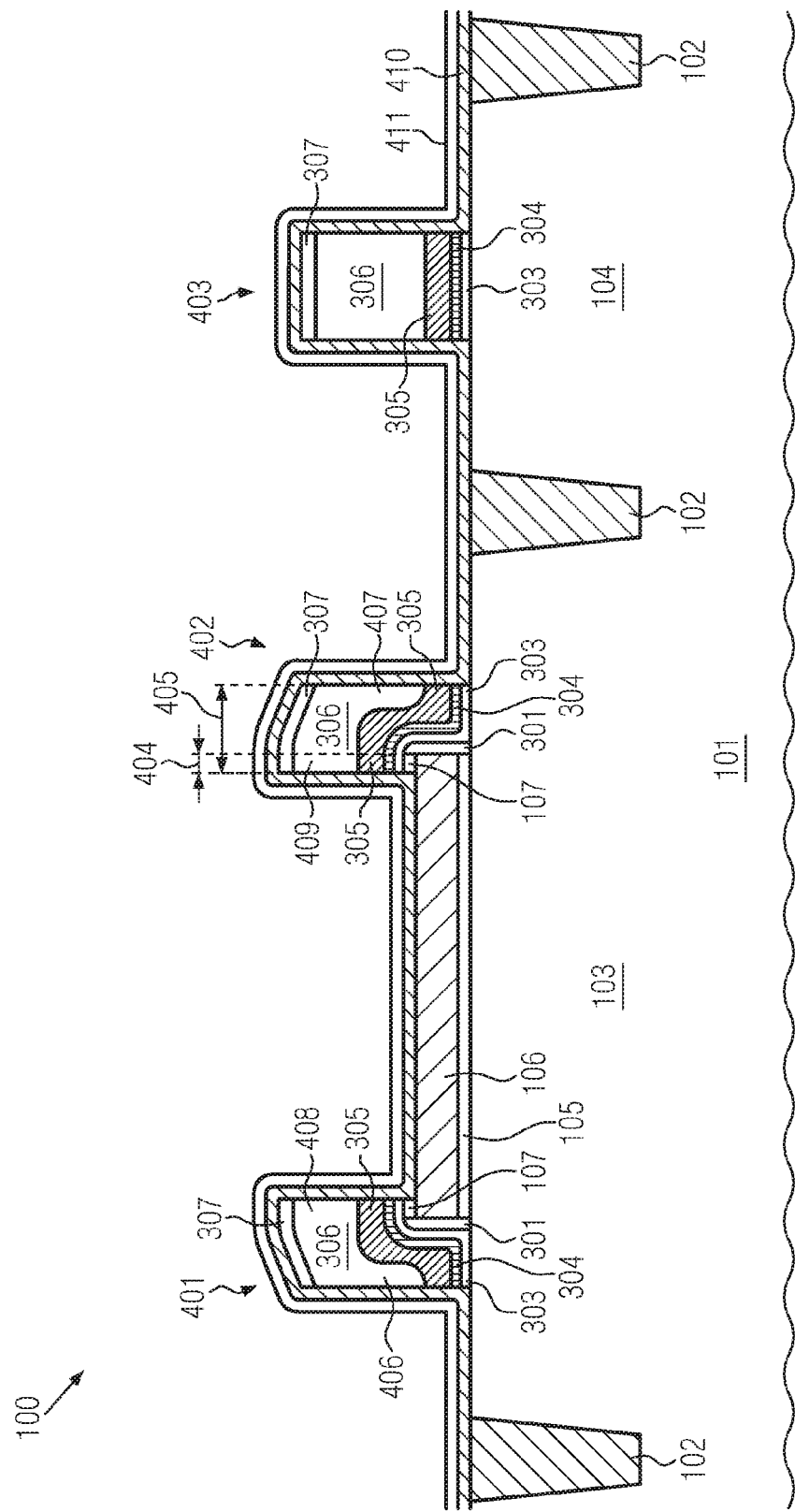
Figure 4B:
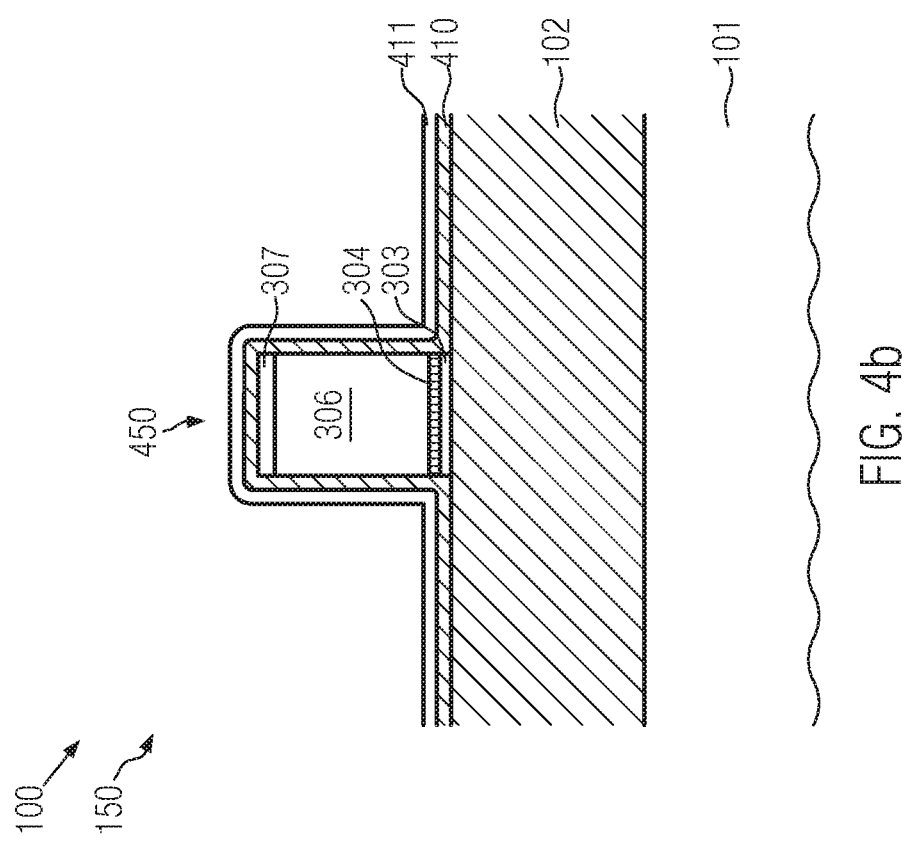

FIGS. 4a and 4b show schematic cross-sectional views of the portions of the semiconductor structure 100 shown in FIGS. 3a and 3b in a later stage of the manufacturing process. After the formation of the gate stack 302, the gate stack 302 may be patterned. This may be done by means of techniques of photolithography and etching that are conventionally employed in the formation of gate electrodes of field effect transistors in accordance with gate-first high-k metal gate techniques and in the formation of polysilicon resistors. In some embodiments, in the patterning of the gate stack 302, the capping layer 307 may be patterned by means of techniques of photolithography and etching to form a hardmask from the capping layer 307. Thereafter, a photoresist mask used in the patterning of the capping layer 307 may be removed by means of a resist strip process, and one or more etch processes adapted for removing materials of the layer 306 of semiconductor material, the metal layer 305, the layer 304 of high-k dielectric material and the base layer 303 may be performed. Portions of the layers 306, 305, 304, 303 below the hardmask formed by the patterning of the capping layer 307 may remain in the semiconductor structure 100. In the patterning of the gate stack 302, select gates 401, 402 may be formed over the nonvolatile memory region 103, a gate 403 of a logic transistor may be formed over the logic transistor region 104, and a resistor 450 may be formed over the resistor region 150. Since the select gates 401, 402 and the gate 403 of the logic transistor have each been formed from the gate stack 302, each of the select gates 401, 402 and the gate 403 of the logic transistor may include corresponding materials. In particular, each of the select gates 401, 402 and the gate 403 of the logic transistor may include a gate insulation layer including a respective portion of the layer 304 of high-k dielectric material, each of the gate insulation layers including substantially the same high-k dielectric material, and a gate electrode including a respective portion of the metal layer 305, each of the gate electrodes including substantially the same metal. The resistor 450 may include portions of the base layer 303, the layer 304 of the high-k dielectric material, and the layer 306 of semiconductor material. The portion of the layer 306 of semiconductor material in the resistor 450, which may include polysilicon, may provide a polysilicon material of the resistor 150. In embodiments wherein the portion of the metal layer 305 over the resistor region 150 is not removed, the resistor 450 may optionally include a portion of the metal layer 305.

In addition to the portions of the layers of the gate stack 302, in the patterning of the gate stack 302, portions of the electrically insulating layer 107 that are not arranged below the select gates 401, 402 may be removed. In particular, in embodiments wherein the electrically insulating layer 107 and the base layer 303 are both formed of silicon dioxide, portions of the base layer 303 and the electrically insulating layer 107 may be removed in a common etch process. Thus, after the patterning of the gate stack 302, the floating gate material of the layer 106 of floating gate material and the semiconductor material of the substrate 101 in the nonvolatile memory region 103 and the logic transistor region 104 may be exposed at the surface of the semiconductor structure 100.

Each of the select gates 401, 402 may include a first portion that is located adjacent the layer 106 of floating gate material and the electrically insulating layers 105, 107. In FIG. 4a, the first portion of the select gate 401 is denoted by reference numeral 406, and the first portion of the select gate 402 is denoted by reference numeral 407. Additionally, each of the select gates 401, 402 may include a second portion that is located over the electrically insulating layers 105, 107 and the layer 106 of floating gate material. In FIG. 4a, reference numeral 408 denotes the second portion of the select gate 401, and reference numeral 409 denotes the second portion of the select gate 402. Each of the second portions 408, 409 of the select gates 401, 402 is separated from the layer 106 of floating gate material by a portion of the electrically insulating layer 107. Furthermore, each of the first portions 406, 407 of the select gates 401, 402 may be separated from the layer 106 of floating gate material by the sidewall spacer 301. A part of the first portions 406, 407 of the select gates adjacent the respective second portions 408, 409 may be arranged over the sidewall spacer 301.

An extension of the first portions 406, 407 of the select gates 401, 402 in a direction from the select gate 401 to the select gate 402, corresponding to a channel length direction of the nonvolatile memory cells to be formed in the nonvolatile memory region 103, may be greater than an extension of the second portions 408, 409 in the channel length direction. In FIG. 4a, reference numeral 404 exemplarily denotes the extension of the second portion 409 of the select gate 402 in the channel length direction, and reference numeral 405 denotes the extension of the entire select gate 402 in the channel length direction, corresponding to a sum of the extension of the first portion 407 of the select gate 402 in the channel length direction and the extension 404 of the second portion 409 of the select gate 402 in the channel length direction. In some embodiments, the extension 405 of the select gate 402 in the channel length direction may be in a range from about 60-150 nm, for example, about 100 nm. The extension 404 of the second portion 409 of the select gate 402 in the channel length direction may be in a range from about 10-40 nm, for example, about 25 nm. The select gate 401 may have dimensions corresponding to those of the select gate 402.

The second portions 408, 409 of the select gates 401, 402 provide an overhang of the select gates 401, 402 over floating gate electrodes that are formed from the layer 106 of floating gate material, as described below.

Dimensions of the gate 403 of the logic transistor may correspond to dimensions of logic transistor gates that are provided in accordance with a high-k metal gate technology, for instance the 28 nm technology node, and dimensions of the resistor 450 may correspond to dimensions of polysilicon resistors provided in accordance with the technology employed.

After the formation of the select gates 401, 402 and the gate 403 of the logic transistor, an encapsulation layer 410 may be deposited over the semiconductor structure 100. The encapsulation layer 410 may include silicon nitride, and it may be formed by means of molecular layer deposition. The encapsulation layer 410 may cover sidewalls of each of the select gates 401, 402, the gate 403 of the logic transistor, and the resistor 450. The encapsulation layer 410 may be provided both at sidewalls of the first portions 406, 407 of the select gates 401, 402 which are located lateral to the layer 106 of floating gate material and at sidewalls of the second portions 408, 409 of the select gates 401, 402 which are located over the layer 106 of floating gate material. The encapsulation layer 410 may provide an encapsulation of the high-k dielectric material of the layer 304 of high-k dielectric material on both sides of the select gates 401, 402. Due to the overhang of the select gates 401, 402 over the layer 106 of floating gate material, the encapsulation layer 410 need not be arranged between the first portions of the select gates 401, 402 and the layer 106 of floating gate material, which may help to avoid topography issues that may occur in nonvolatile memory cells wherein the entire select gate is arranged adjacent the floating gate.

After the formation of the encapsulation layer 410, a layer 411 of sidewall spacer material may be deposited over the semiconductor structure 100. The layer 411 of sidewall spacer material may be formed of a material that may be etched selectively relative to the material of the encapsulation layer 410. In embodiments wherein the encapsulation layer 410 includes silicon nitride, the layer 411 of sidewall spacer material may include silicon dioxide.

Figure 5A:
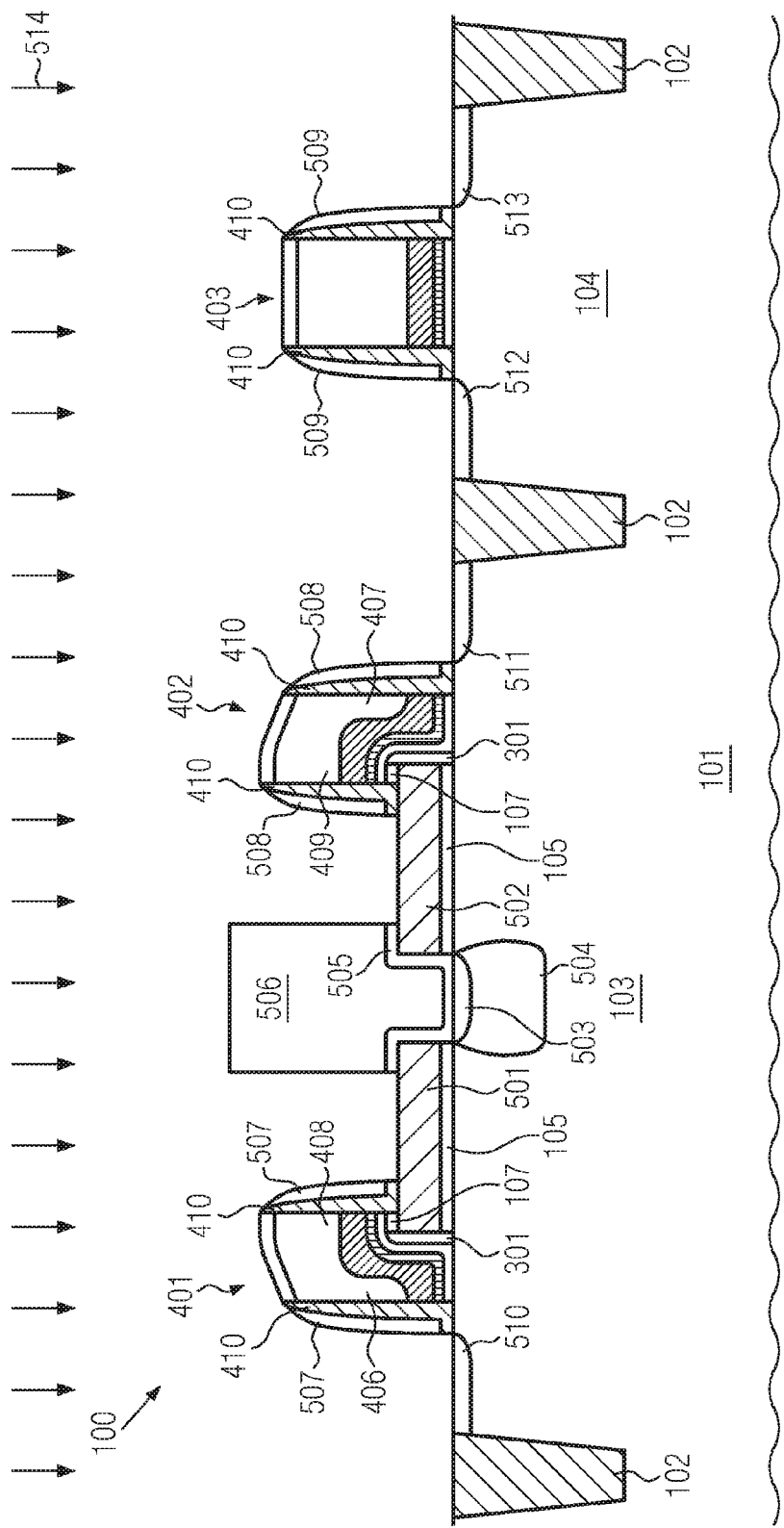
Figure 5B:
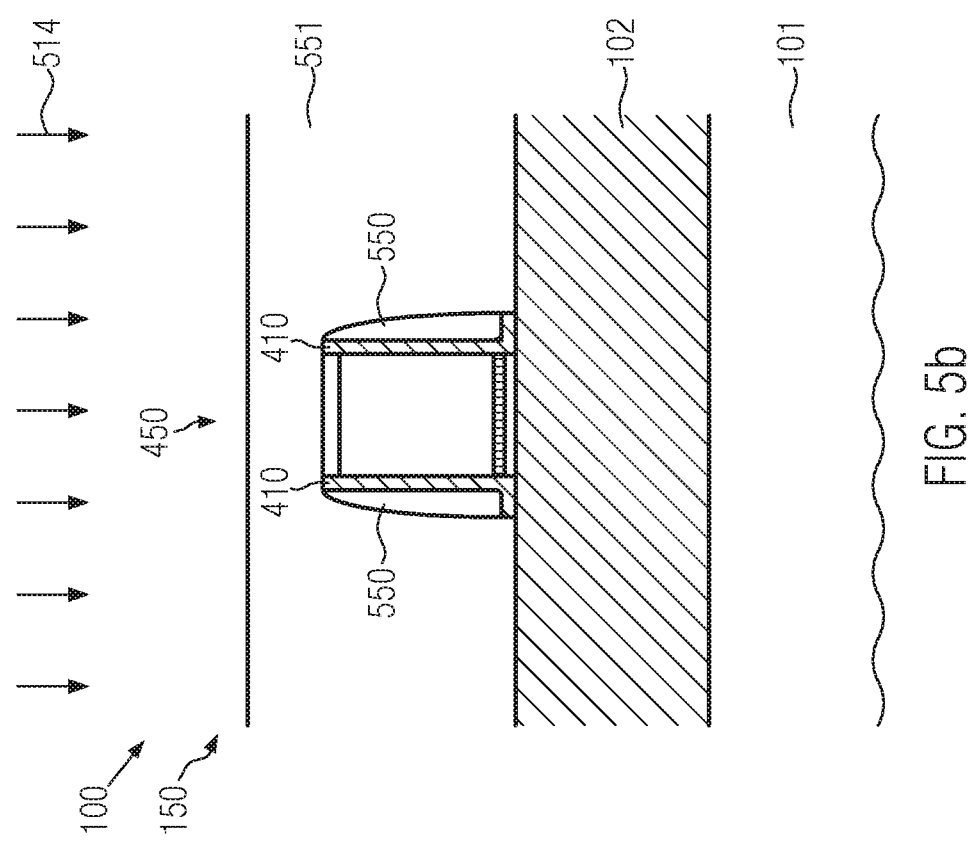

FIGS. 5a and 5b show schematic cross-sectional views of the portions of the semiconductor structure 100 shown in FIGS. 4a and 4b in a later stage of the manufacturing process. For clarity of illustration, in FIGS. 5a and 5b, some of the reference numerals of features of the semiconductor structure 100 shown in FIGS. 4a and 4b have been omitted. Unless explicitly indicated otherwise, features shown in FIGS. 4a and 4b whose reference numerals have been omitted in FIGS. 5a and 5b, and which are shown in FIGS. 5a and 5b, may still be present in the semiconductor structure 100 at the stage of the manufacturing process illustrated in FIGS. 5a and 5b.

After the deposition of the encapsulation layer 410 and the layer 411 of sidewall spacer material, a floating gate 501 and a floating gate 502 may be formed on the basis of the layer 106 of floating gate material. Each of the floating gates 501, 502 will be provided in one of the pair of nonvolatile memory cells that is formed in the nonvolatile memory region 103. Adjacent the floating gates 501, 502, a source region 504, that is doped differently than portions of the semiconductor material of the nonvolatile memory region 103 below the floating gates 501, 502 and the select gates 401, 402, may be formed. Over the source region 504, an erase gate 506 may be formed. The erase gate 506 may include a semiconductor material, for example, polysilicon. The erase gate 506 may be separated from the floating gates 501 by a tunneling layer 505. A portion of the tunneling layer 505 may also be provided between the erase gate 506 and the source region 504. The tunneling layer 505 may be formed of an electrically insulating material, such as silicon dioxide. In some embodiments, in addition to the portion of the tunneling layer 505, an insulation region 503 may be provided between the erase gate 506 and the source region 504. The insulation region 503 may include an oxide of the semiconductor material of the substrate 101, for example, silicon dioxide.

The source region 504 provides a common source region of the nonvolatile memory cells that are formed in the nonvolatile memory region 103, and the erase gate 506 provides a common erase gate of the nonvolatile memory cells.

The source region 504 and the erase gate 506 are arranged on a side of the floating gate 501 opposite to the select gate 401 and on a side of the floating gate 502 opposite to the select gate 402. As shown in FIG. 5a, the erase gate 506 and the tunneling layer 505 may include portions that are arranged over the floating gates 501, 502 so that there is an overhang of the erase gate 506 and the tunneling layer 505 over the floating gates 501, 502.

In some embodiments, techniques for obtaining a self-alignment between the source region 504 and the erase gate 506 may be used in the formation of the source region 504, the insulation region 503, the tunneling layer 505 and the erase gate 506. For this purpose, a layer of a hardmask material (not shown) may be formed over the semiconductor structure 100. The layer of hardmask material may be formed of a material that may be etched selectively relative to the material of the layer 411 of sidewall spacer material. In embodiments wherein the layer 411 of sidewall spacer material includes silicon dioxide, the hardmask material may include silicon nitride. A thickness of the layer of hardmask material may be greater than the height of the erase gate 506. In some embodiments, the layer of hardmask material may be polished, for example, by means of chemical mechanical polishing, to obtain a substantially planar surface of the layer of hardmask material without bumps over the select gates 401, 402 and the gate 403 of the logic transistor, which might be caused by the topology of the select gates 401, 402 and the gate 403 of the logic transistor. The layer of hardmask material may cover the select gates 401, 402 and the gate 403 of the logic transistor so that the select gates 401, 402 and the gate 403 of the logic transistor are not exposed at the surface of the semiconductor structure 100.

The layer of hardmask material may be patterned to form a hardmask having an opening at the location where the erase gate 506 is to be formed. For obtaining the overhang of the erase gate 506 and the tunneling layer 505 over the floating gates 501, 502, a sacrificial sidewall spacer may be formed at the sidewalls of the opening of the hardmask using techniques of isotropic deposition and anisotropic etching. Then, one or more etch processes adapted for removing the materials of the layer 106 of floating gate material and the electrically insulating layer 105 may be performed. Then, the insulation region 503 may be formed using known techniques for the local oxidation of silicon (LOCOS), and an ion implantation process may be performed for forming the source region 504 by implantation of ions of a dopant into the semiconductor material of the substrate 101 in the nonvolatile memory region 103. Thereafter, the sacrificial sidewall spacer formed at the sidewalls of the opening of the hardmask may be removed, and the tunneling layer 505 may be formed using techniques of deposition and/or oxidation. Thereafter, a layer of the material of the erase gate 506, for example a polysilicon layer, may be deposited over the semiconductor structure 100, for example, by means of chemical vapor deposition or plasma-enhanced chemical vapor deposition. Thereafter, a chemical mechanical polishing process may be performed for removing portions of the layer of the material of the erase gate 506 and/or the material of the tunneling layer 505 outside the opening of the hardmask. Then, the hardmask may be removed by means of an etch process that is adapted to selectively remove the material of the hardmask relative to the materials of the erase gate 506 and the layer 411 of sidewall spacer material.

Thereafter, an anisotropic etch process that is adapted to selectively remove the material of the layer 411 of sidewall spacer material relative to the material of the encapsulation layer 410 may be performed. Portions of the layer 411 of sidewall spacer material at sidewalls of the select gates 401, 402, the gate 403 of the logic transistor and the resistor 450 may remain in the semiconductor structure 100 due to the anisotropy of the etch process so that sidewall spacers 507, 508, 509, 550 are formed at sidewalls of the select gates 401, 402, the gate 403 of the logic transistor and the resistor 450. Then, an etch process adapted to remove the material of the encapsulation layer 410 may be performed. Portions of the encapsulation layer 410 that are covered by the sidewall spacers 507, 508, 509, 550 may remain in the semiconductor structure 100 so that the high-k dielectric materials of the select gates 401, 402, the gate 403 of the logic transistor and the resistor 450 remain encapsulated by the encapsulation layer 410.

After the formation of the sidewall spacers 507, 508, 509, 550, a mask 551, for example a photoresist mask, may be formed over the resistor region 150, and an ion implantation process, that is schematically illustrated by arrows 514 in FIGS. 5a and 5b, may be performed. In the ion implantation process 514, the semiconductor structure 100 may be irradiated with ions of a dopant so that drain extensions 510, 511 are formed adjacent the select gates 401, 402, and a source extension 512 and a drain extension 513 are formed adjacent the gate 403 of the logic transistor. The mask 551 absorbs ions impinging on the resistor region 150, so that a doping of the resistor 450 may be avoided. In some embodiments, additional ion implantation processes may be performed to obtain a desired doping of the resistor 450, which may be different from the doping of the source and drain extensions 510 to 513. During these ion implantation processes, the nonvolatile memory region 103 and the logic transistor region 104 may be covered by a mask absorbing ions (not shown).

Figure 6A:
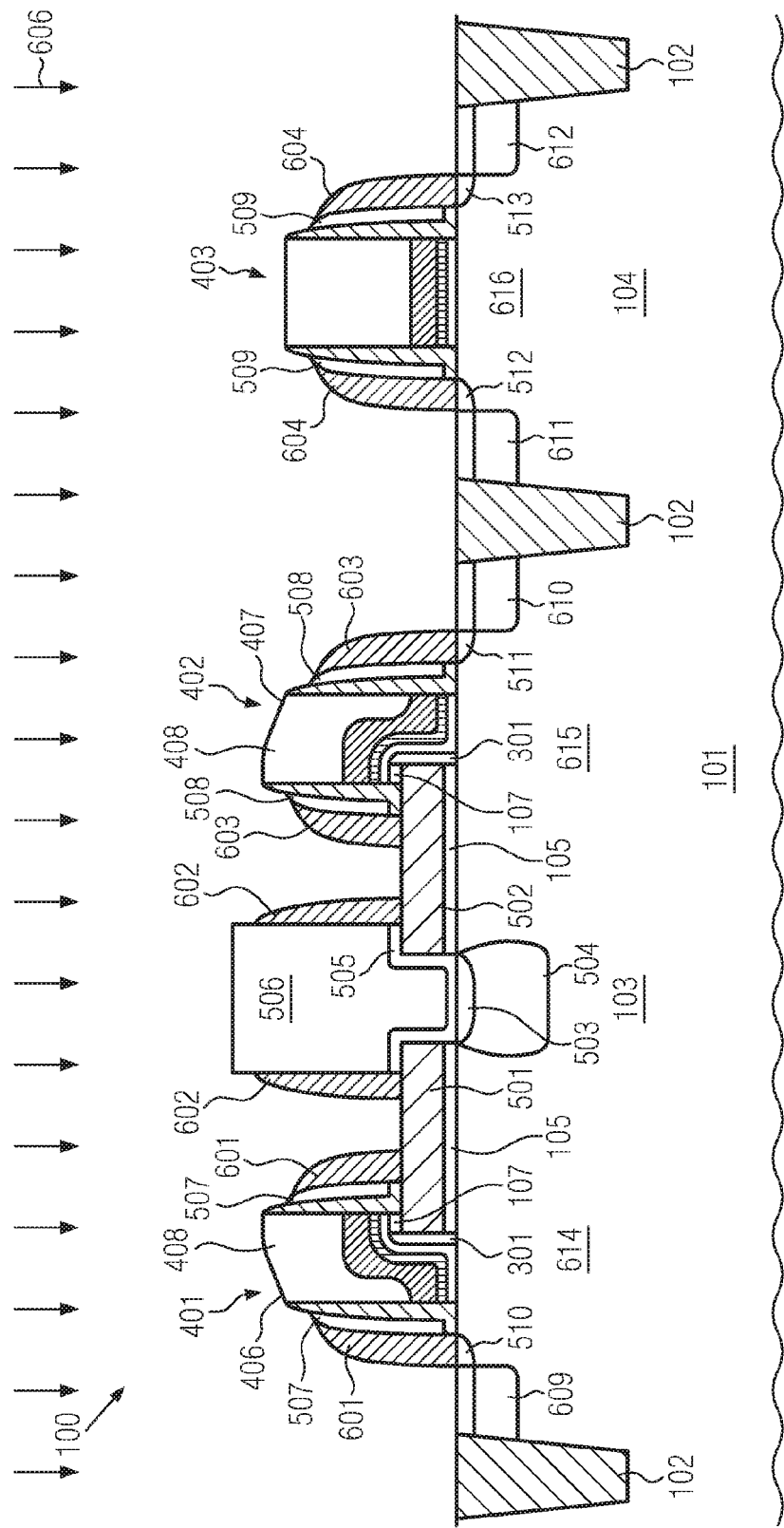

FIGS. 6a and 6b show schematic cross-sectional views of the semiconductor structure 100 in a later stage of the manufacturing process. For clarity of illustration, in FIGS. 6a and 6b, some reference numerals of elements of the semiconductor structure 100 have been omitted. Unless explicitly indicated otherwise, features shown in FIGS. 5a and 5b whose reference numerals have been omitted in FIGS. 6a and 6b, and which are shown in FIGS. 6a and 6b, may still be present in the semiconductor structure 100 at the stage of the manufacturing process illustrated in FIGS. 6a and 6b.

After the formation of the drain extensions 510, 511, the source extension 512 and the drain extension 513, a sidewall spacer 601 may be formed adjacent the select gate 401, a sidewall spacer 602 may be formed adjacent the erase gate 506, a sidewall spacer 603 may be formed adjacent the select gate 402, and a sidewall spacer 604 may be formed adjacent the gate 403 of the logic transistor. Additionally, a sidewall spacer 605 may be formed adjacent the resistor 450. For forming the sidewall spacers 601, 602, 603, 604, 605, a layer of a material of the sidewall spacers 601, 602, 603, 604, 605, for example a silicon nitride layer, may be deposited over the semiconductor structure 100, and an anisotropic etch process may be performed for removing portions of the layer of the material of the sidewall spacers 601, 602, 603, 604, 605 over substantially horizontal portions of the semiconductor structure 100. In some embodiments, a liner layer, for example a silicon dioxide layer (not shown), may be provided below the layer of the material of the sidewall spacers 601, 602, 603, 604, 605 which may be used as an etch stop layer.

In some embodiments, in the formation of the sidewall spacers 601, 602, 603, 604, 605, a certain amount of over-etching may be performed, so that a height of the sidewall spacers 601, 602, 603, 604, 605, being an extension of the sidewall spacers 601 to 605 in a thickness direction of the substrate 101 (vertical in the cross-sectional views of FIGS. 6a and 6b) is smaller than a height of the respective one of the select gates 401, 402, the erase gate 506, the gate 403 of the logic transistor and the resistor 450, adjacent to which the respective one of the sidewall spacers 601 to 605 is formed. Additionally, due to the over-etching, the capping layer 307 may be removed from the select gates 401, 402, the gate 403 of the logic transistor and the resistor 450, and the height of the sidewall spacers 507, 508, 509, 550 may also be reduced.

Then, a mask 607 may be formed over the resistor region 150. The mask 607 may be a photoresist mask, and it may be formed by means of a photolithography process.

Thereafter, an ion implantation process, that is schematically illustrated by arrows 606 in FIGS. 6a and 6b, may be performed. In the ion implantation process 606, the semiconductor structure 100 may be irradiated with ions of a dopant. Thus, drain regions 609, 610 may be formed adjacent the select gates 401, 402, and a source region 611 and a drain region 612 may be formed adjacent the gate 403 of the logic transistor. The drain regions 609, 610 and the drain extensions 510, 511 are arranged at sides of the first portions 406, 407 of the select gates 401 and 402 that are opposite to the floating gates 501, 502, respectively.

Portions of the nonvolatile memory region 103 between the source region 504 and the drain region 609 may have a doping that corresponds to the initial doping of the nonvolatile memory region 103 and form a channel region 614 having a portion below the first portion 406 of the select gate 401 and a portion below the floating gate 501. Portions of the nonvolatile memory region 103 between the source region 504 and the drain region 610 may have a doping that substantially corresponds to the initial doping of the nonvolatile memory region 103 and form a channel region 615 having a portion below the first portion 407 of the select gate 402 and a portion below the floating gate 502. Similarly, in the logic transistor region 104, a channel region 616 may be provided between the source region 611 and the drain region 612 below the gate electrode 403 of the logic transistor.

In some embodiments, the source region 504, the drain region 609, 610 and the drain extensions 510, 511 may be N-doped and the channel regions 614, 615 may be substantially undoped or P-doped.

In the ion implantation process 606, the mask 607 absorbs ions impinging on the resistor region 150, so that an introduction of dopants into the resistor 450 may be substantially avoided or at least reduced. Thus, an undesirable increase of the conductivity of the poly silicon material of the resistor 450 may be substantially avoided or at least reduced.

Figure 7A:
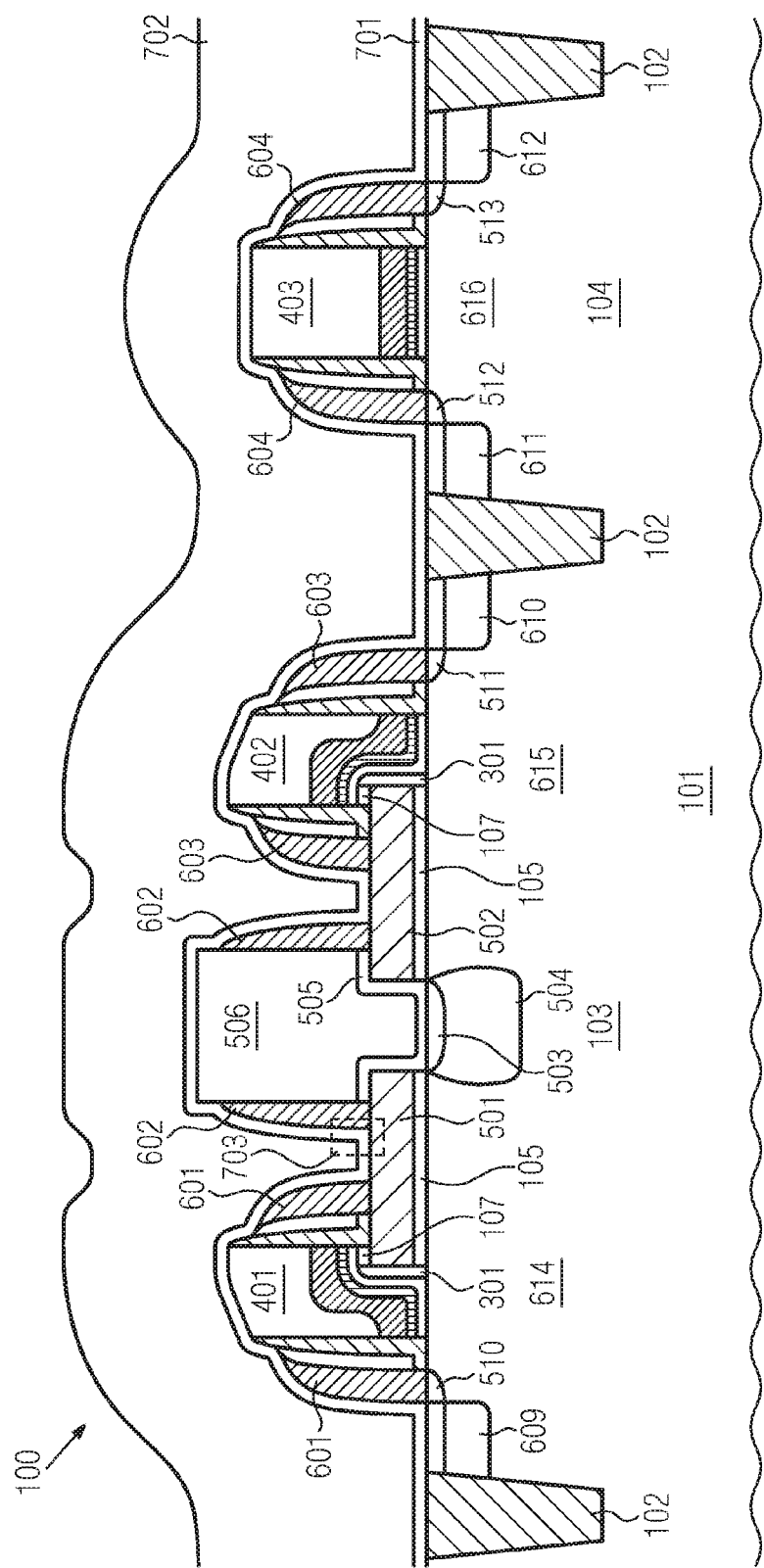
Figure 7C:
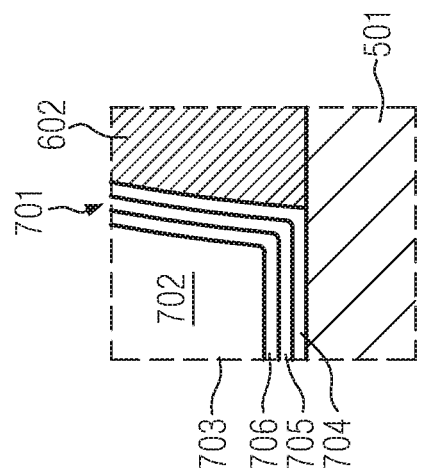
Figure 7B:
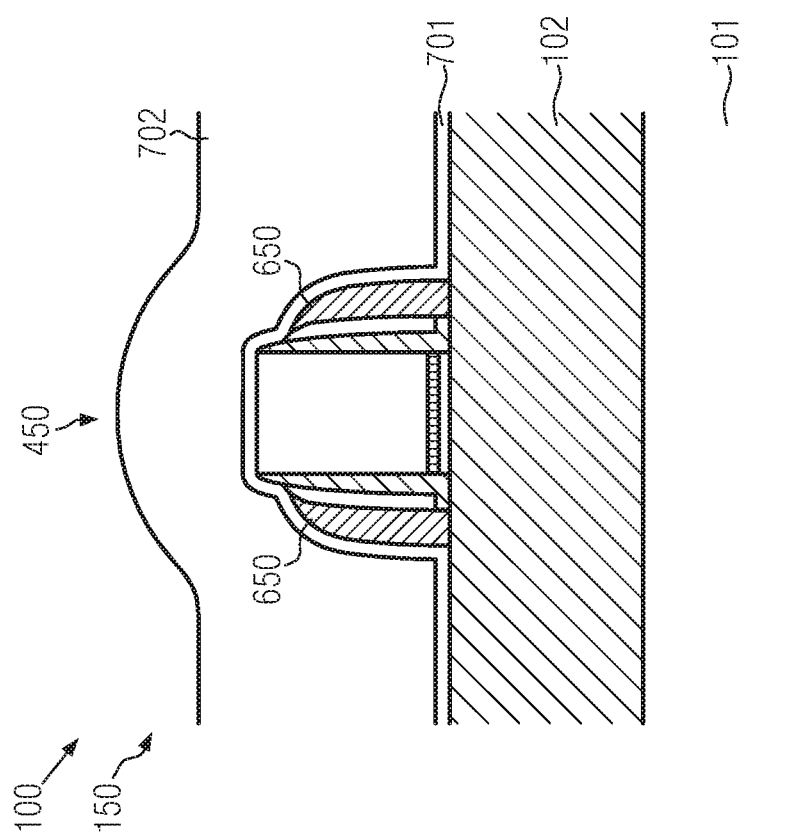

FIGS. 7a and 7b show schematic cross-sectional views of the portions of the semiconductor structure 100 shown in FIGS. 6a and 6b in a later stage of the manufacturing process. For clarity of illustration, in FIGS. 7a and 7b, some reference numerals of elements of the semiconductor structure 100 have been omitted. Unless explicitly indicated otherwise, features shown in FIGS. 6a and 6b whose reference numerals have been omitted in FIGS. 7a and 7b, and which are shown in FIGS. 7a and 7b, may still be present in the semiconductor structure 100 at the stage of the manufacturing process illustrated in FIGS. 7a and 7b.

After the ion implantation process 606, the mask 607 may be removed by means of a resist strip process. Thereafter, a control gate insulation material layer 701 may be formed over the semiconductor structure 100. FIG. 7c shows an enlarged view of a portion 703 of the semiconductor structure 100, wherein details of the control gate insulation material layer 701 which have been omitted for clarity of illustration in FIGS. 7a and 7b are shown. The control gate insulation material layer 701 may include sublayers 704, 705, 706. The sublayer 705 is provided over the sublayer 704, and the sublayer 706 is provided over the sublayer 705. The sublayers 704, 706 may include silicon dioxide and the sublayer 705 may include silicon nitride. Thus, the sublayers 704, 705, 706 of the control gate insulation material layer 701 may provide an oxide-nitride-oxide layer stack.

For forming the control gate insulation material layer 701, deposition techniques such as chemical vapor deposition and plasma enhanced chemical vapor deposition may be used. In some embodiments, substantially isotropic deposition processes may be used for the formation of the sublayers 704, 705, 706, so that thicknesses of portions of the sublayers 704, 705, 706 deposited on substantially horizontal portions of the semiconductor structure 100 such as, for example, surfaces of the floating gates 501, 502, are approximately equal to thicknesses of portions of the sublayers 704, 705, 706 on inclined portions of the semiconductor structure 100 such as, for example, surfaces of the sidewall spaces 601, 602, 603 at the select gates 401, 402 and the erase gate 506. Accordingly, a total thickness of portions of the control gate insulation material layer 701 on substantially horizontal portions of the semiconductor structure 100 may also be approximately equal to a total thickness of portions of the control gate insulation material layer 701 on inclined portions of the semiconductor structure 100. In some embodiments, the total thickness of the control gate insulation material layer 701 may have a value in a range from about 10-20 µm, for example a value of about 15 µm. The thicknesses of the sublayers 704, 705, 706 may be controlled relatively precisely by varying parameters of the deposition processes used for the formation thereof, such as, for example, compositions of reactant gases used, pressure and flows of the reactant gases, durations of the deposition processes and/or a plasma power and a bias power employed.

After the formation of the control gate insulation material layer 701, a control gate material layer 702 may be deposited over the control gate insulation material layer 701. The control gate material layer 702 may include a semiconductor material such as, for example, polysilicon, and it may be formed by means of a chemical vapor deposition process or a plasma enhanced chemical vapor deposition process adapted for the deposition of polysilicon.

In some embodiments, the control gate material layer 702 may be deposited directly after the deposition of the topmost sublayer 706 of the control gate insulation material layer 701. In some embodiments, the control gate material layer 702 and the topmost sublayer 706 of the control gate insulation material layer 701 and/or all of the sublayers 704, 705, 706 of the control gate insulation material layer 701 may be deposited in a same chemical vapor deposition reactor or plasma enhanced chemical vapor deposition reactor. In other embodiments, different reactors may be used for the formation of the control gate insulation material layer 701 and the control gate material layer 702, and the semiconductor structure 100 may be transferred directly from the reactor wherein the control gate insulation material layer 701 is deposited to the reactor employed for the deposition of the control gate material layer 702. Depositing the control gate material layer 702 directly after the deposition of the topmost sublayer 706 of the control gate insulation material layer 701 may help to reduce a risk of contaminations at the interface between the control gate insulation material layer 701 and the control gate material layer 702. In particular, portions of the control gate insulation material layer 701 on the floating gates 501, 502 which, as will be described in more detail below, provide control gate insulation layers of the nonvolatile memory cells formed at the nonvolatile memory cell region 103, may be sealed by the control gate material layer 702, so that contaminations of the control gate insulation layers (for example, by metal such as nickel) may be substantially avoided or at least reduced.

Figure 8A:
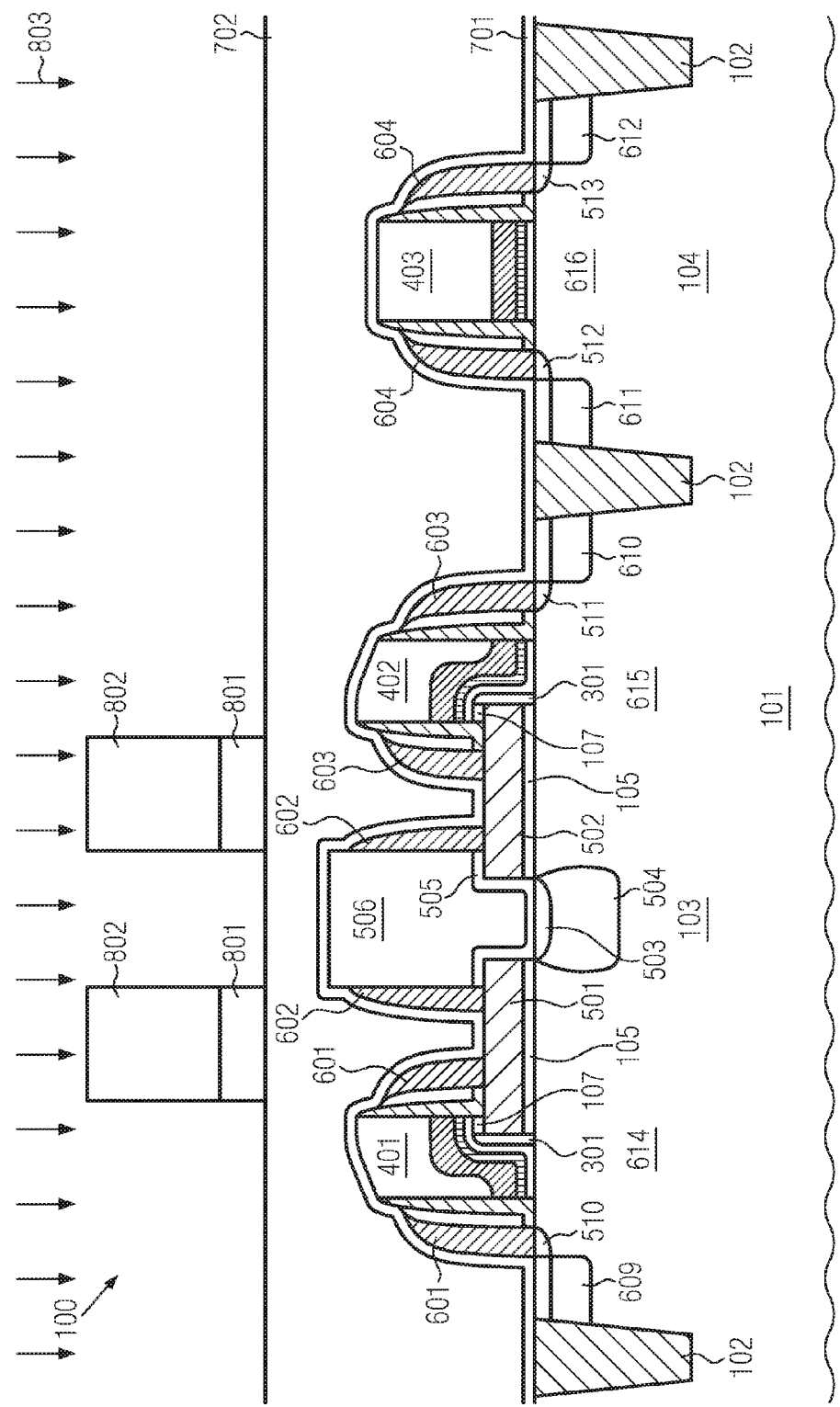
Figure 8B:
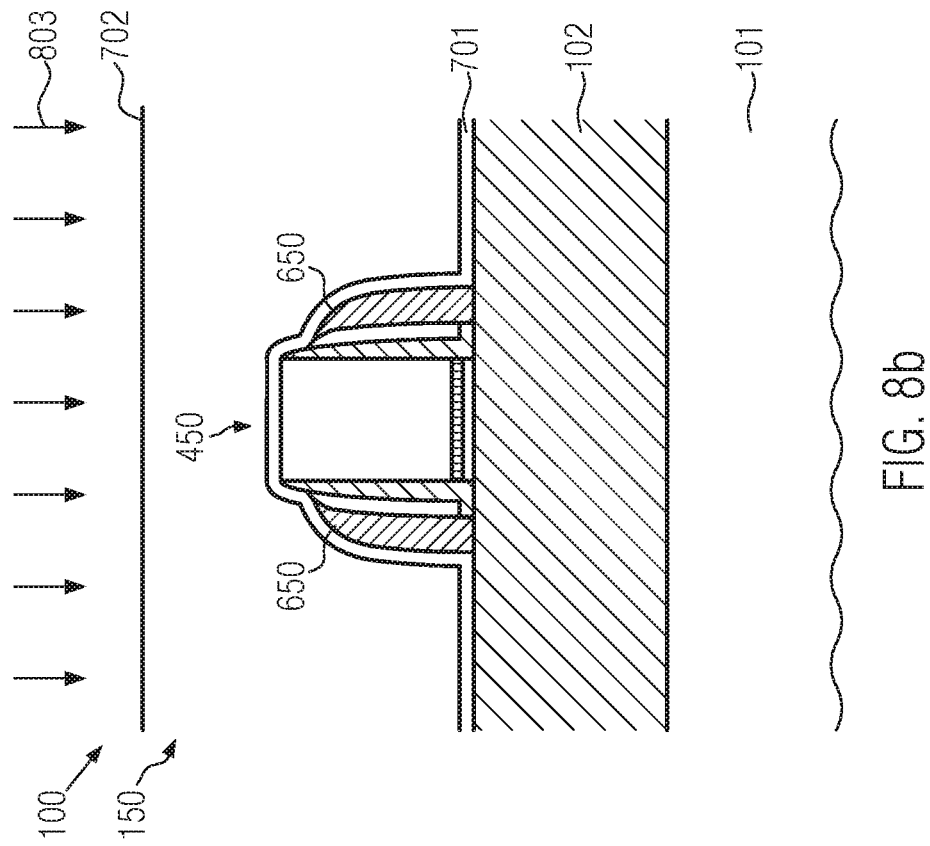

FIGS. 8a and 8b show schematic cross-sectional views of the portions of the semiconductor structure 100 shown in FIGS. 7a and 7b at a later stage of the manufacturing process. After the deposition of the control gate material layer 702, the control gate material layer 702 may be planarized, for example, by means of a chemical mechanical polishing process. Thus, a substantially flat surface of the control gate material layer 702 may be obtained.

After the planarization of the control gate material layer 702, the control gate material layer 702 may be patterned. For this purpose, a mask 802 may be formed over the semiconductor structure 100. Between the mask 802 and the control gate material layer 702, a bottom anti-reflective coating layer 801 may be provided. The mask 802 and the bottom anti-reflective coating layer 801 may be formed by means of known techniques of photolithography, wherein a layer of a material of the bottom anti-reflective coating layer 801 and a photoresist layer are deposited on the semiconductor structure 100, the photoresist layer is exposed and developed to form the mask 802, and an etch process adapted to remove portions of the material of the bottom anti-reflective coating layer 801 that are not covered by the mask 802 is performed.

The mask 802 may be provided over portions of the nonvolatile memory region 103 where control gates (denoted by reference numerals 901 and 902 in FIG. 9a) are to be formed. In particular, the mask 802 may be provided over portions of the floating gates 501, 502 between the select gates 401, 402 and the erase gate 506. Other portions of the nonvolatile memory region 103, as well as the logic transistor region 104 and the resistor region 150 need not be covered by the mask 802 and the bottom anti-reflective coating layer 801, so that the control gate material layer 702 is exposed at the surface of the semiconductor structure 100 in those parts of the semiconductor structure 100.

After the formation of the mask 802 and the bottom anti-reflective coating layer 801, an etch process 803 that is adapted to selectively remove the material of the control gate material layer 702 relative to the material of the topmost sublayer 706 of the control gate insulation material layer 701 may be performed. In some embodiments, the etch process 803 may be a dry etch process, for example, a reactive ion etch process, that is adapted to selectively remove polysilicon relative to silicon dioxide.

Figure 9A:
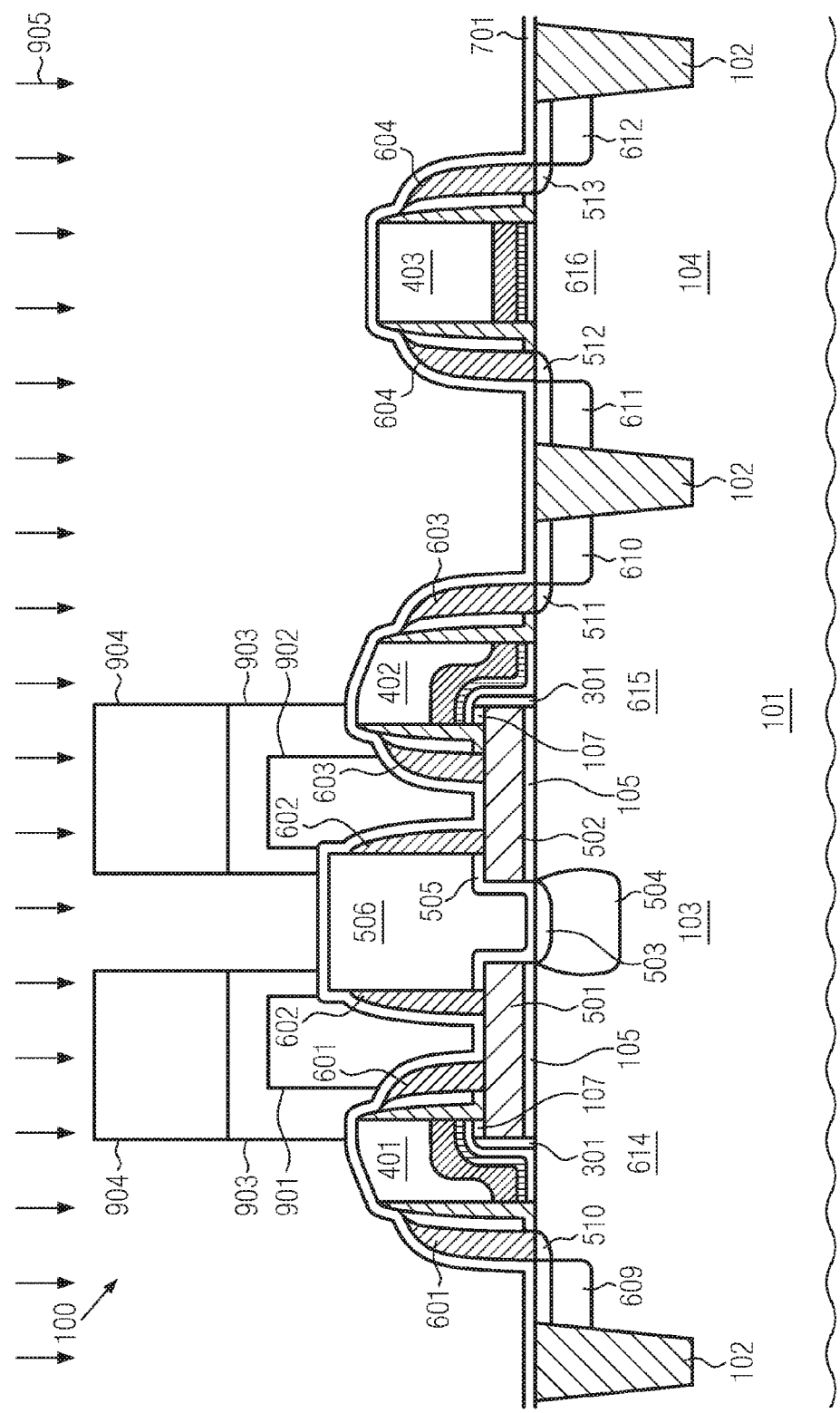

FIGS. 9a and 9b show schematic cross-sectional views of the portions of the semiconductor structure 100 shown in FIGS. 8a and 8b at a later stage of the manufacturing process. The etch process 803 may remove portions of the control gate material layer 702 that are not covered by the mask 802 and the bottom anti-reflective coating layer 801 from the semiconductor structure 100. Portions of the control gate material layer 702 below the mask 802 may remain in the semiconductor structure 100, and may provide control gates 901, 902. In particular, portions of the control gate material layer 702 over the logic transistor region 104 and the resistor region 150 may be removed by the etch process 803. Due to the selectivity of the etch process 803, the control gate insulation material layer 701 may substantially remain in the semiconductor structure 100, and may protect portions of the semiconductor structure 100 below the control gate insulation material layer 701 from being affected by the etch process 803. In particular, the select gates 401, 402 and the gate 403 of the logic transistor, which may include gate insulation layers of a high-k material and gate electrodes including a metal layer, and which may have a relatively high sensitivity, may be protected from an adverse influence of the etch process 803 by the control gate insulation material layer 701.

A portion of the control gate insulation layer 701 below the control gate 901 may provide a control gate insulation layer of the control gate 901, which provides electrical insulation between the control gate 901 and the floating gate 501. Similarly, a portion of the control gate insulation material layer 701 below the control gate 902 may provide a control gate insulation layer of the control gate 902, which electrically insulates the control gate 902 from the floating gate 502. Portions of the control gate insulation material layer 701 at the sidewall spacers 601, 602, 603 as well as portions of the control gate insulation material layer 701 at the select gates 401, 402 and the erase gate 506 may provide an electrical insulation between the control gates 901, 902 on the one hand, and the select gates 401, 402 and the erase gate 506, on the other hand. After the patterning of the control gate material layer 702 by means of the etch process 803, the mask 802 and the bottom anti-reflective coating 801 may be removed from the semiconductor structure 100 by means of known resist strip techniques.

Then, the control gate insulation material layer 701 may be patterned. For this purpose, a bottom anti-reflective coating layer 903 and a mask 904 may be formed over the semiconductor structure 100. Similar to the mask 802 and the bottom anti-reflective coating layer 801 described above with reference to FIGS. 8a and 8b, the mask 904 and the bottom anti-reflective coating layer 903 may be formed by means of known photolithography techniques.

The mask 904 and the bottom anti-reflective coating layer 903 may cover the control gates 901, 902. Additionally, the mask 904 and the bottom anti-reflective coating layer 903 may be provided over portions of the semiconductor structure 100 that are not covered by the control gates 901, 902. In particular, as shown in FIG. 9a, the mask 904 and the bottom anti-reflective coating layer 903 may be provided over portions of the select gates 401, 402 and the erase gate 506 on sides of the select gates 401, 402 and the erase gate 506 facing the control gates 901, 902. Portions of the select gates 401, 402 on sides of the select gates 401, 402 opposite the control gates 901, 902, as well as a portion of the erase gate 506 at a center of the erase gate 506 need not be covered by the mask 904 and the bottom anti-reflective coating layer 903, so that the control gate insulation material layer 701 is exposed at the surface of the semiconductor structure 100. Additionally, the mask 904 and the bottom anti-reflective coating layer 903 need not cover the drain regions 609, 610 and the field effect transistor region 104. The resistor region 150 and, in particular, the resistor 450 provided in the resistor region 150 may be covered by the mask 904 and the bottom anti-reflective coating layer 903, as shown in FIG. 9b.

After the formation of the mask 904 and the bottom anti-reflective coating layer 903, one or more etch processes 905 can be performed. The one or more etch processes 905 may be adapted to remove the materials of at least the sublayers 705, 706 of the control gate insulation material layer 701. In some embodiments, the one or more etch processes 905 may include an etch process adapted for selectively removing the material of the top most sublayer 706 of the control gate insulation material layer 701 relative to the material of the sublayer 705, for example, a dry etch process adapted for selectively removing silicon dioxide relative to silicon nitride. After this etch process, another etch process adapted for selectively removing the material of the sublayer 705 relative to the material of the sublayer 704, for example, a dry etch process adapted for selectively removing silicon nitride relative to silicon dioxide, may be performed.

Thus, portions of the sublayers 705, 706 that are not covered by the mask 904 and the bottom anti-reflective coating layer 903 may be removed from the semiconductor structure 100.

In some embodiments, portions of the lowest sublayer 704 of the control gate insulation material layer 701 that are not covered by the mask 904 and the bottom anti-reflective coating layer 903 are not removed from the semiconductor structure 100 by the one or more etch processes 905 and may be removed at a later stage of the manufacturing process, as will be detailed below.

Figure 10A:
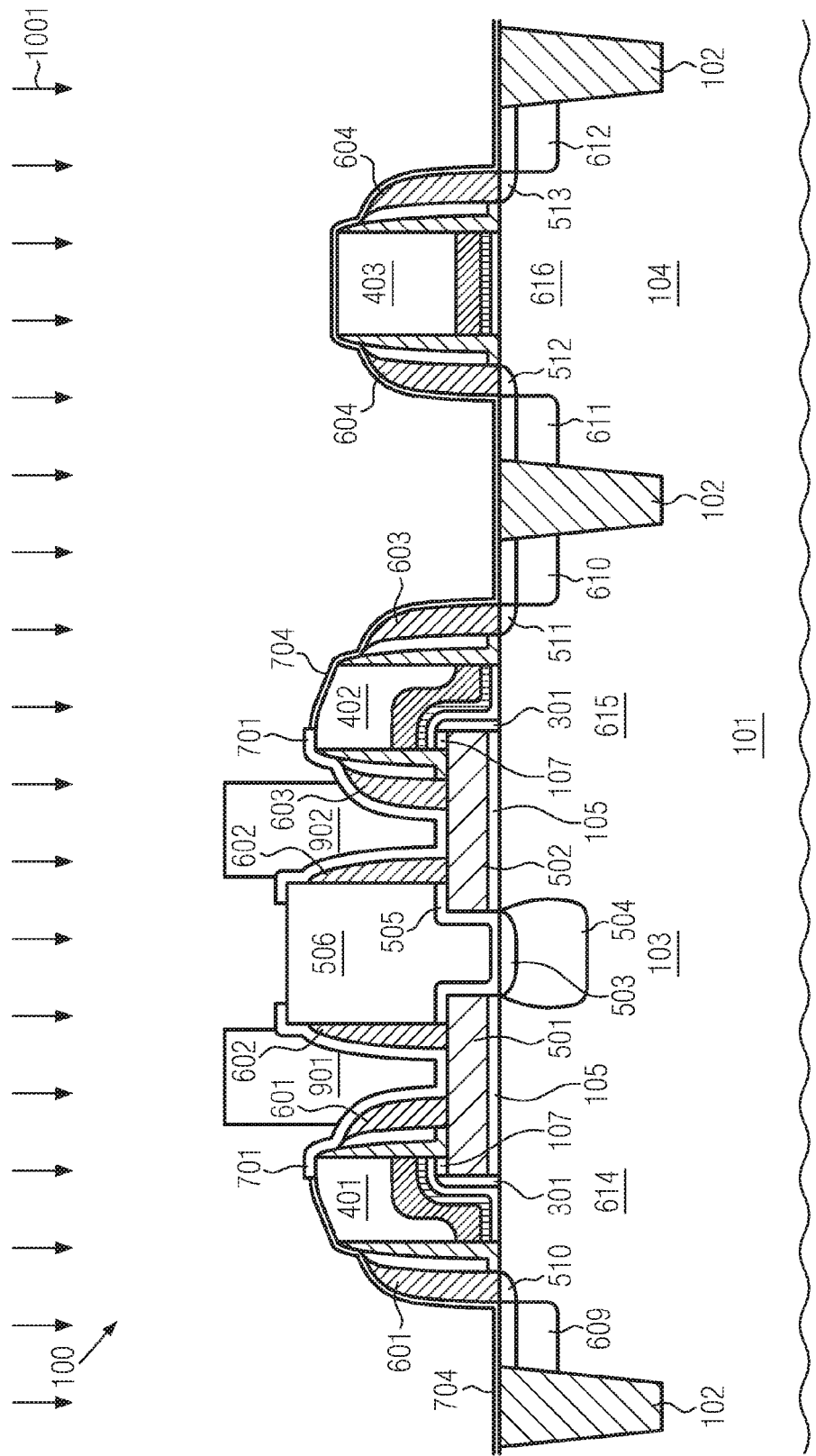

FIGS. 10a and 10b show schematic cross-sectional views of the portions of the semiconductor structure 100 shown in FIGS. 9a and 9b at a later stage of the manufacturing process. After the one or more etch processes 905, the mask 904 and the bottom anti-reflective coating layer 903 may be removed by means of a resist strip process.

Thereafter, a pre-clean process 1001 may be performed. The pre-clean process 1001 may be adapted for selectively removing the material of the lowest sublayer 704 of the control gate insulation material layer 701 relative to other materials in the semiconductor structure 100. In particular, the pre-clean process 1001 may selectively remove the material of the sublayer 704 relative to the material of the sublayer 705. In some embodiments, the pre-clean process 1001 may include a wet etch process wherein an etchant including an aqueous solution of hydrogen fluoride is used, and which may selectively remove silicon dioxide relative to silicon nitride.

In some embodiments, the pre-clean process 1001 may also remove portions of the topmost sublayer 706 of the control gate insulation material layer 701 that are not covered by the control gates 901, 902. After the pre-clean process 1001, portions of the select gates 401, 402 and the erase gate 506 on sides of the select gates 401, 402 and the erase gate 506 facing the control gates 901, 902 may be covered at least by the sublayers 704, 705 of the control gate insulation material layer 701. Similarly, after the pre-clean process 1001, the resistor 450 may be covered by at least the sublayers 704, 705 of the control gate insulation material layer 701. These portions of the patterned control gate insulation layer 701 may provide a silicide block layer. Portions of the select gates 401, 402 on sides of the select gates 401, 402 opposite the control gates 901, 902 and a portion of the erase gate 506 at the center of the erase gate 506, the drain regions 609, 610 in the nonvolatile memory region 103, as well as the source region 611, the drain region 612 and the gate 403 at the logic transistor region 104 may be exposed at the surface of the semiconductor structure 100 after the pre-clean process 1001.

Figure 11A:
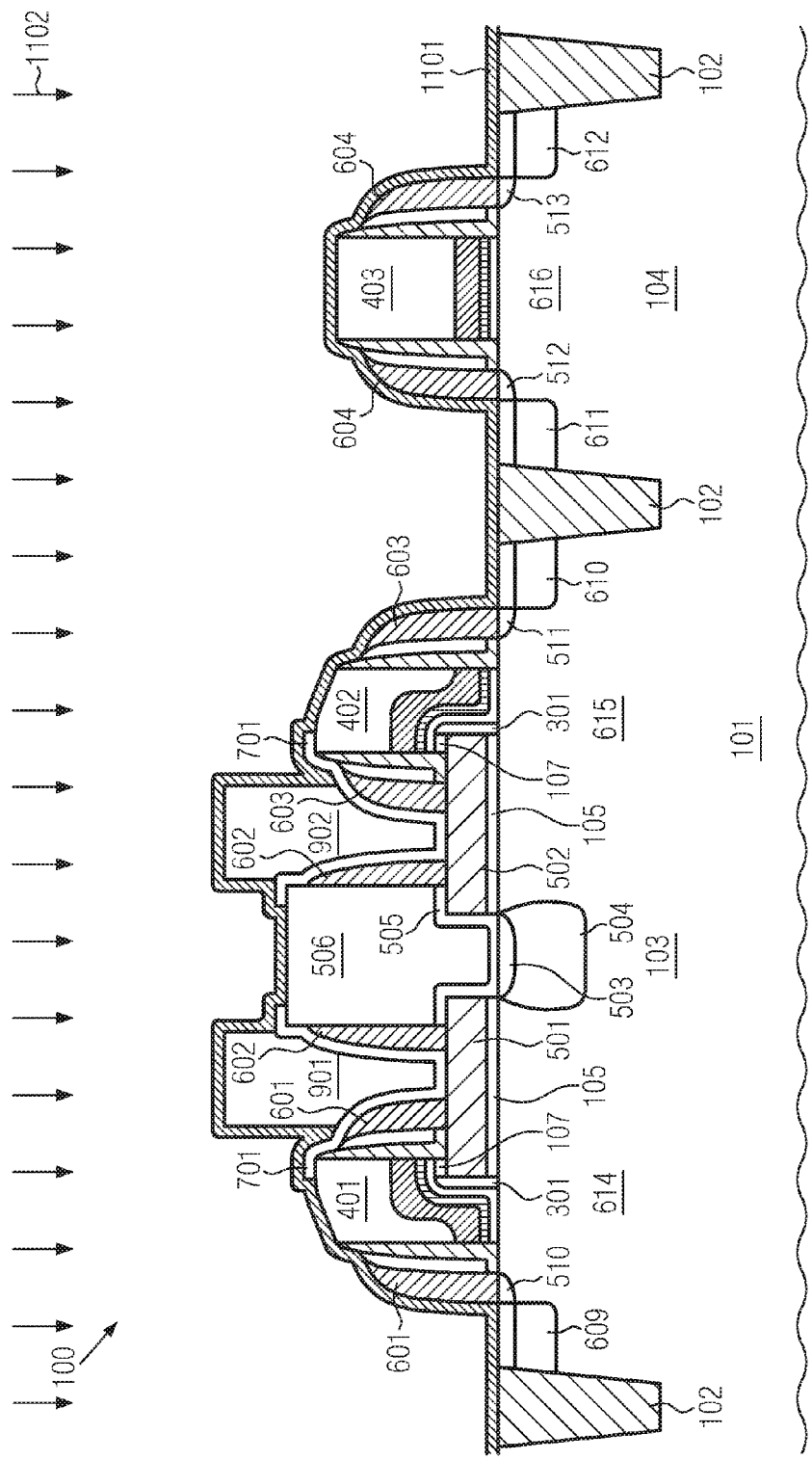
Figure 11B:
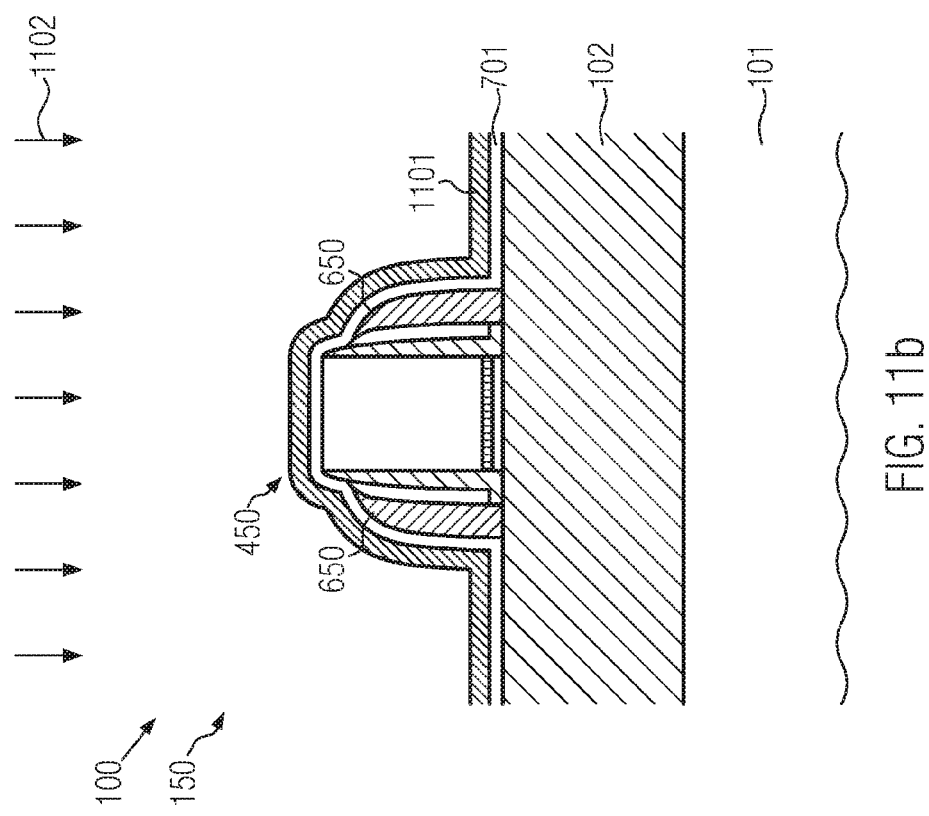

FIGS. 11a and 11b show schematic cross-sectional views of the portions of the semiconductor structure 100 shown in FIGS. 10a and 10b at a later stage of the manufacturing process. After the pre-clean process 1001, a silicidation process may be performed. The silicidation process may include a deposition of a metal layer 1101 over the semiconductor structure 100. The metal layer 1101 may include a metal that is suitable for forming a metal silicide, for example, nickel. The metal layer 1101 may be deposited by means of a physical vapor deposition process such as, for example, sputtering.

After the formation of the metal layer 1101, one or more annealing processes may be performed, which are schematically illustrated by arrows 1102 in FIGS. 11a and 11b. In some embodiments, the one or more annealing processes 1102 may include one or more rapid thermal annealing processes.

The one or more annealing processes 1102 may initiate a chemical reaction between the metal of the metal layer 1101 and silicon wherein a silicide is formed. In particular, a chemical reaction may occur between the metal of the metal 1101 and the silicon in the drain regions 609, 610 in the nonvolatile memory region 103, and the silicon in the source region 611 and the drain region 612 in the logic transistor region 104. Additionally, a chemical reaction between the metal of the metal layer 1101 and the polysilicon in the select gates 401, 402, the erase gate 506, the control gates 901, 902 and the gate 403 of the logic transistor may occur.

The silicide block layer provided by the portions of at least the sublayers 704, 705 of the control gate insulation material layer 701 may separate the metal layer 1101 from portions of the semiconductor structure 100 below the silicide block layer, and may prevent a formation of silicide in portions of the semiconductor structure 100 including silicon below the silicide block layer. In particular, the silicide block layer may prevent a formation of silicide in portions of the select gates 401, 402 and the erase gate 506 facing the control gates 901, 902, and the silicide block layer may prevent a formation of silicide in the polysilicon of the resistor 450, which might lead to an undesirable reduction of the resistance of the resistor 450.

Figure 12A:
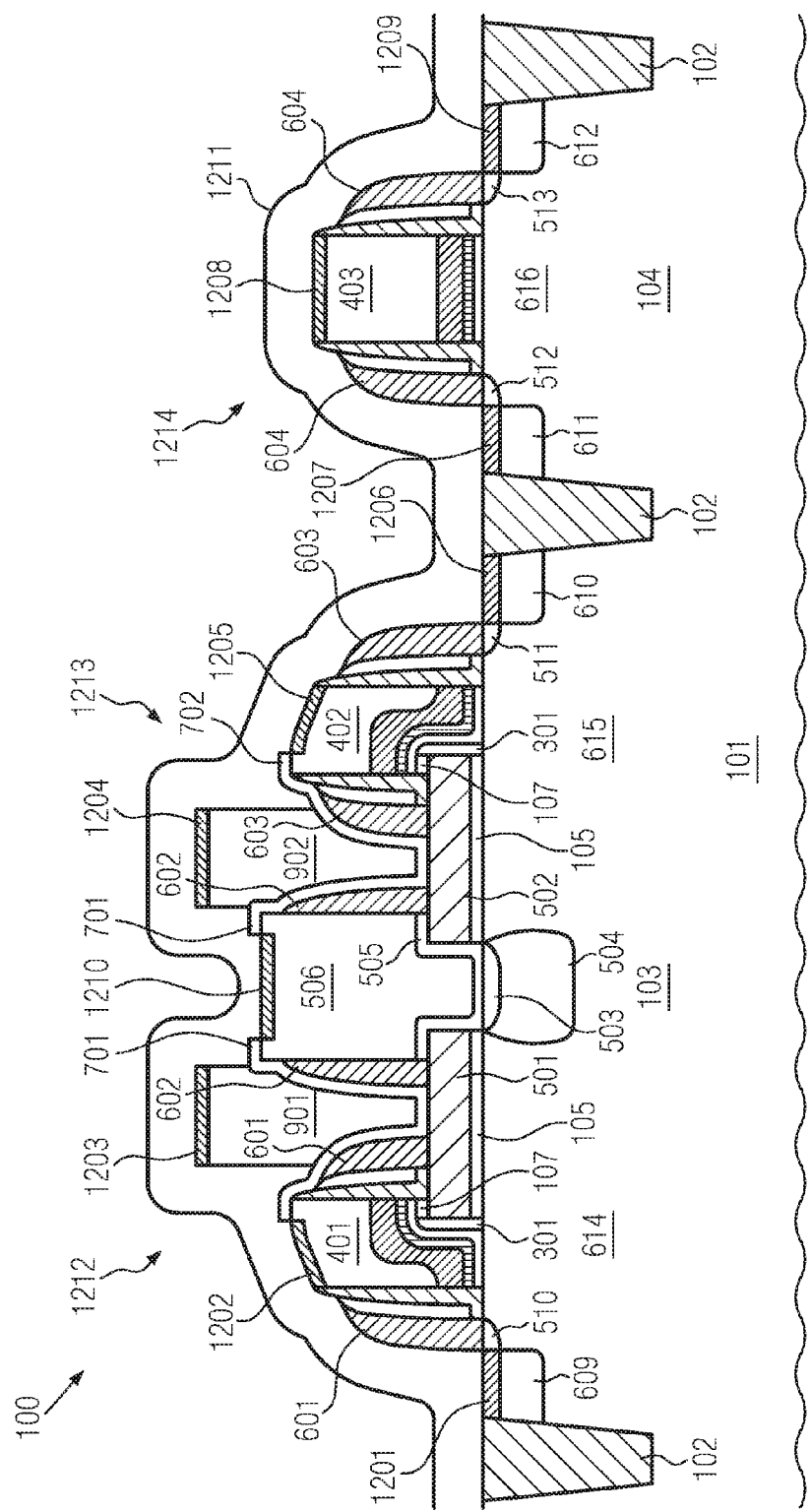

FIGS. 12*a* and 12*b* show schematic cross-sectional views of the portions of the semiconductor structure 100 shown in FIGS. 11*a* and 11*b* at a later stage of the manufacturing process. After the one or more annealing processes 1102, an etch process adapted for removing unreacted metal of the metal layer 1101 may be performed.

In the silicidation process, silicide regions 1201, 1206, 1207, 1209 may be formed in the drain regions 609, 610 in the nonvolatile memory region 103, as well as in the source region 611 and the drain region 612 of the field effect transistor region 104. Additionally, silicide regions 1203, 1204 may be formed in the control gates 901, 902, a silicide region 1208 may be formed in the gate 403 of the logic transistor, and silicide regions 1202, 1205, 1210 may be formed in portions of the select gates 401, 402 and the erase gate 506 that are not covered by the silicide block layer. In the resistor 450, no silicide region needs to be formed.

The present disclosure is not limited to embodiments wherein no silicide at all is provided in the resistor 450. In other embodiments, silicide regions may be provided in contact areas of the resistor region 150, which are used for making electrical connections to the resistor 450. In portions of the resistor 450 between the contact areas, the silicide block layer may be provided as described above, so that a formation of silicide in these portions of the resistor 450 may be avoided.

After the removal of unreacted metal of the metal layer 1101, a dielectric layer 1211, which may include silicon dioxide, silicon nitride and/or silicon oxynitride, may be deposited over the semiconductor structure 100, for example, by means of a chemical vapor deposition process or a plasma enhanced chemical vapor deposition process.

After the completion of the steps of the manufacturing process described above, the semiconductor structure 100 includes a nonvolatile memory cell 1212 and a nonvolatile memory cell 1213, which are provided at the nonvolatile memory region 103. The nonvolatile memory cell 1212 includes, in particular, the select gate 401, the control gate 901, the erase gate 506, the floating gate 501, the source region 504, the channel region 614 and the drain region 609.

The nonvolatile memory cell 1213 includes, in particular, the select gate 402, the control gate 902, the erase gate 506, the floating gate 502, the source region 504, the channel region 615 and the drain region 610, wherein the source region 504 and the erase gate 506 are common to the nonvolatile memory cells 1212, 1213. Control gate insulation layers of the nonvolatile memory cells 1212, 1213 are provided by the portions of the control gate insulation material layer 701 at the control gate 901 and at the control gate 902.

Additionally, the semiconductor structure 100 includes a field effect transistor 1214 at the field effect transistor region 104. The field effect transistor 1214 includes, in particular, the source region 611, the channel region 616, the drain region 612 and the gate 403.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   providing a semiconductor structure comprising a nonvolatile memory cell element comprising a floating gate, a select gate and an erase gate formed over a semiconductor material, said select gate and said erase gate being arranged at opposite sides of said floating gate;
   forming a control gate insulation material layer over said semiconductor structure;
   forming a control gate material layer over said control gate insulation material layer;
   performing a first patterning process that forms a control gate over said floating gate and comprises a first etch process that selectively removes a material of said control gate material layer relative to a material of said control gate insulation material layer; and
   performing a second patterning process that patterns said control gate insulation material layer, said patterned control gate insulation material layer covering portions of said semiconductor structure that are not covered by said control gate.

2. The method of claim 1, wherein the formation of said control gate insulation material layer comprises:
   depositing a first sublayer of said control gate insulation material layer over said semiconductor structure, said first sublayer comprising silicon dioxide;
   depositing a second sublayer of said control gate insulation material layer over said first sublayer, said second sublayer comprising silicon nitride; and depositing a third sublayer of said control gate insulation material layer over said second sublayer, said third sublayer comprising silicon dioxide.

3. The method of claim 2, wherein said control gate material layer comprises polysilicon, and wherein the formation of said control gate material layer comprises:
depositing a polysilicon layer over said third sublayer of said control gate insulation material layer; and
performing a polishing process that planarizes said polysilicon layer.

4. The method of claim 3, wherein said depositing of said polysilicon layer is performed directly after said depositing of said third sublayer of said control gate insulation material layer.

5. The method of claim 4, wherein said select gate comprises a gate electrode comprising a metal layer and a gate insulation layer comprising a dielectric material having a greater dielectric constant than silicon dioxide, and wherein said select gate is completely covered by said control gate insulation material layer during said first etch process.

6. The method of claim 5, wherein said erase gate is completely covered by said control gate insulation material layer during said first etch process.

7. The method of claim 6, wherein said patterned control gate insulation material layer covers a first portion of said select gate at a side of said select gate facing said control gate, a second portion of said select gate at a side of said select gate opposite said control gate not being covered by said patterned control gate insulation material layer.

8. The method of claim 7, wherein said patterned control gate insulation material layer covers a first portion of said erase gate at a side of said erase gate facing said control gate, a second portion of said erase gate at a center of said erase gate not being covered by said patterned control gate insulation layer.

9. The method of claim 8, further comprising performing a silicidation process after said second patterning process, said silicidation process being performed in the presence of said patterned control gate insulation layer, wherein said patterned control gate insulation material layer substantially blocks a silicidation of portions of said semiconductor structure below said patterned control gate insulation material layer.

10. The method of claim 9, wherein said semiconductor structure further comprises a polysilicon resistor, and wherein said patterned control gate insulation layer covers at least a portion of said polysilicon resistor.

11. The method of claim 10, further comprising forming a first sidewall spacer adjacent said select gate and a second sidewall spacer adjacent said erase gate before said formation of said control gate insulation material layer.

12. The method of claim 11, wherein said first patterning process comprises a first photolithography process wherein a first photoresist mask is formed over said control gate material layer, said first etch process being performed in the presence of said first photoresist mask.

13. The method of claim 12, wherein said second patterning process comprises:
a second photolithography process wherein a second photoresist mask is formed over said control gate and over portions of said semiconductor structure that are to be covered by said patterned control gate insulation material layer; and
a second etch process wherein at least portions of said third sublayer and said second sublayer of said control gate insulation material layer that are not covered by said second photoresist mask are removed.

14. The method of claim 13, wherein said second patterning process further comprises:
a resist strip process wherein said second photoresist mask is removed; and
a pre-clean process performed after said resist strip process wherein portions of said first sublayer of said control gate insulation material layer that are not covered by said second sublayer of said control gate insulation material layer are removed.

15. A method, comprising:
providing a semiconductor structure comprising a nonvolatile memory cell element and a polysilicon resistor element, said nonvolatile memory cell element comprising a floating gate over a semiconductor material, said polysilicon resistor element comprising a polysilicon material;
forming a control gate insulation material layer over said semiconductor structure, said control gate insulation material layer comprising a first sublayer comprising silicon dioxide, a second sublayer over said first sublayer comprising silicon nitride and a third sublayer over said second sublayer comprising silicon dioxide;
forming a control gate over said floating gate, a first portion of said control gate insulation material layer being arranged between said floating gate and said control gate;
patterning said control gate insulation material layer, wherein a silicide block layer is formed from a second portion of said control gate insulation material layer over at least a part of said polysilicon material of said polysilicon resistor; and
performing a silicidation process, wherein said silicide block layer substantially prevents a formation of silicide in said at least a part of said polysilicon material below said silicide block layer.

16. The method of claim 15, wherein said nonvolatile memory cell element further comprises a select gate and an erase gate arranged at opposite sides of said floating gate, a third portion of said control gate insulation material layer being arranged between said control gate and said select gate, a fourth portion of said control gate insulation material layer being arranged between said control gate and said erase gate.

17. The method of claim 16, wherein said select gate comprises a gate electrode comprising a metal layer and a gate insulation layer comprising a dielectric material having a greater dielectric constant than silicon dioxide.

18. The method of claim 17, wherein said formation of said control gate comprises:
depositing a polysilicon layer over said control gate insulation material layer;
planarizing said polysilicon layer; and
patterning said polysilicon layer, said patterning of said polysilicon layer comprising an etch process wherein said control gate insulation material layer is used as an etch stop layer.

19. The method of claim 18, wherein said depositing of said polysilicon layer is performed directly after a deposition of said third sublayer of said control gate insulation material layer.

20. A semiconductor structure, comprising:
a nonvolatile memory cell comprising a floating gate over a semiconductor material, a control gate over said floating gate and a source region, a channel region and a drain region provided in said semiconductor material, wherein at least one of said drain region and said control gate comprises a silicide;
a polysilicon resistor comprising a polysilicon material; and
a first silicon dioxide layer, a silicon nitride layer over said first silicon dioxide layer and a second silicon dioxide layer over said silicon nitride layer;
wherein portions of said first silicon dioxide layer, said silicon nitride layer and said second silicon dioxide layer at said control gate provide a control gate insulation layer, at least a portion of said control gate insulation layer being provided between said control gate and said floating gate; and
wherein portions of at least said first silicon dioxide layer and said silicon nitride layer over at least a portion of said polysilicon material of said polysilicon resistor provide a silicide block layer, wherein substantially no silicide is provided in said at least a portion of said polysilicon material below said silicide block layer.

* * * * *